US005649223A

United States Patent [19]

Freeman

[11] Patent Number: 5,649,223

[45] Date of Patent: Jul. 15, 1997

[54] WORD BASED TEXT PRODUCING SYSTEM

[76] Inventor: Alfred B. Freeman, 420 Tibbetts Hill Rd., Goffstown, N.H. 03045

[21] Appl. No.: 808,843

[22] Filed: Dec. 17, 1991

Related U.S. Application Data

[63] Continuation-in-part of Ser. No. 440,994, Nov. 22, 1989, abandoned, which is a continuation-in-part of Ser. No. 392,727, Aug. 11, 1989, abandoned, and Ser. No. 288,011, Dec. 21, 1988, abandoned.

[51] Int. Cl.$^6$ .......... G06F 3/14

[52] U.S. Cl. .......... 395/796; 341/20; 341/22; 341/23; 400/98

[58] Field of Search .......... 364/419, 419.1, 364/419.14, 419.15, 419.17, 709.01, 709.11, 709.12, 709.16; 400/110, 421, 98, 420; 341/20, 21, 22, 23, 35; 345/145, 146, 168, 179, 184

[56] References Cited

U.S. PATENT DOCUMENTS

| | | | |
|---|---|---|---|
| 3,879,722 | 4/1975 | Knowlton | 340/711 |
| 4,242,676 | 12/1980 | Piquet et al. | 341/23 |
| 4,333,097 | 6/1982 | Buric et al. | 340/711 |
| 4,365,235 | 12/1982 | Greanias et al. | 340/146.3 |
| 4,374,625 | 2/1983 | Hanft et al. | 400/98 |
| 4,383,307 | 5/1983 | Gibson, III | 364/900 |

(List continued on next page.)

FOREIGN PATENT DOCUMENTS 0672988 9/1995 European Pat. Off. .......... G08F 17/27

OTHER PUBLICATIONS

"Typewriter Keyboard Addition Based on Word Concept" by Chang, I. F., Nov. 1979 vol. 22, No. 6, *IBM Technical Disclosure Bulletin.*

"Multilingual Word Processing", by Joseph D. Becker *Scientific American,* Jul. 1984, pp. 96–107.

"The Point of the Pen", by Robert M. Carr *Byte,* Feb. 1991, pp. 211–221.

"Touch–and–Feel Interfaces", by Andrew Reinhardt *Byte,* Feb. 1919, pp. 223–226.

*Primary Examiner*—Jeffery Hofsass
*Assistant Examiner*—Andrew Hill

[57] ABSTRACT

On word starts, the system displays sets of very frequent words and attributes in locations which associate them with input actions. Possible attributes include letters, phonetic sounds, character strokes or parameters as appropriate for the language. Attributes inputted select word sets from a vocabulary which has N sets of a plurality of word sets in which the words of each set share a unique set of one to N attributes. The display presents accessed word sets which the user may search for wanted words. Vocabulary words include codes to select inflection sets when they are selected. For alphabetic languages, spelling rules and a store of modified word ends and inflection starts are used in the application of inflections. Selected words, with or without inflections, are outputted by input actions which may append 'Space' or punctuation endings. User actions on keyboard and/or stroke sensing apparatus input attributes and select, inflect, and output words with endings. Some keyboard apparatus responds to key combinations and others to single keys. Stroke apparatus senses motion of a pen in each of a plurality of directions and patterns and inputs data items associated with the respective motions by the positions of the displayed items with respect to a reference location.

20 Claims, 10 Drawing Sheets

Microfiche Appendix Included
(2 Microfiche, 107 Pages)

U.S. PATENT DOCUMENTS

| | | | |
|---|---|---|---|
| 4,396,992 | 8/1983 | Hayashi et al. | 364/419.15 |
| 4,420,817 | 12/1983 | Yoshida | 364/900 |
| 4,459,049 | 7/1984 | Howell et al. | 400/98 |
| 4,462,703 | 7/1984 | Lee | 400/110 |
| 4,464,070 | 8/1984 | Hanft et al. | 400/98 |
| 4,566,065 | 1/1986 | Toth | 364/300 |
| 4,594,686 | 6/1986 | Yoshida | 364/900 |
| 4,760,528 | 7/1968 | Levin | 364/419 |
| 4,775,956 | 10/1988 | Kaji et al. | 364/900 |
| 4,783,761 | 11/1988 | Grey et al. | 364/900 |
| 4,868,750 | 9/1989 | Kucera | 364/419 |
| 4,891,786 | 1/1990 | Goldwasser | 364/419 |
| 4,893,238 | 1/1990 | Venema | 364/419 |
| 4,969,097 | 11/1990 | Levin | 364/419.15 |
| 5,119,296 | 6/1992 | Zheng et al. | 364/419 |
| 5,151,950 | 9/1992 | Hullender | 382/13 |
| 5,187,480 | 2/1993 | Thomas et al. | 341/22 |
| 5,200,988 | 4/1993 | Riskin | 379/52 |
| 5,214,428 | 5/1993 | Allen | 341/20 |
| 5,229,936 | 7/1993 | Decker et al. | 364/419 |
| 5,367,453 | 11/1994 | Capps et al. | 364/419.13 |
| 5,442,547 | 8/1995 | Kutsumi et al. | 364/419.08 |
| 5,479,383 | 12/1995 | Tsuneyoshi | 364/14 |

FIG. 1
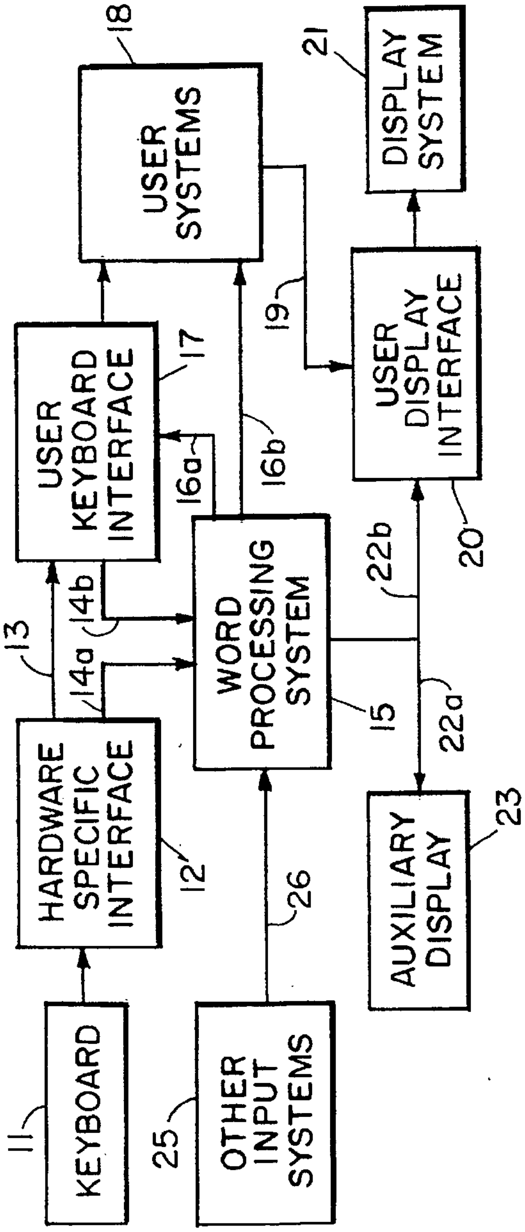
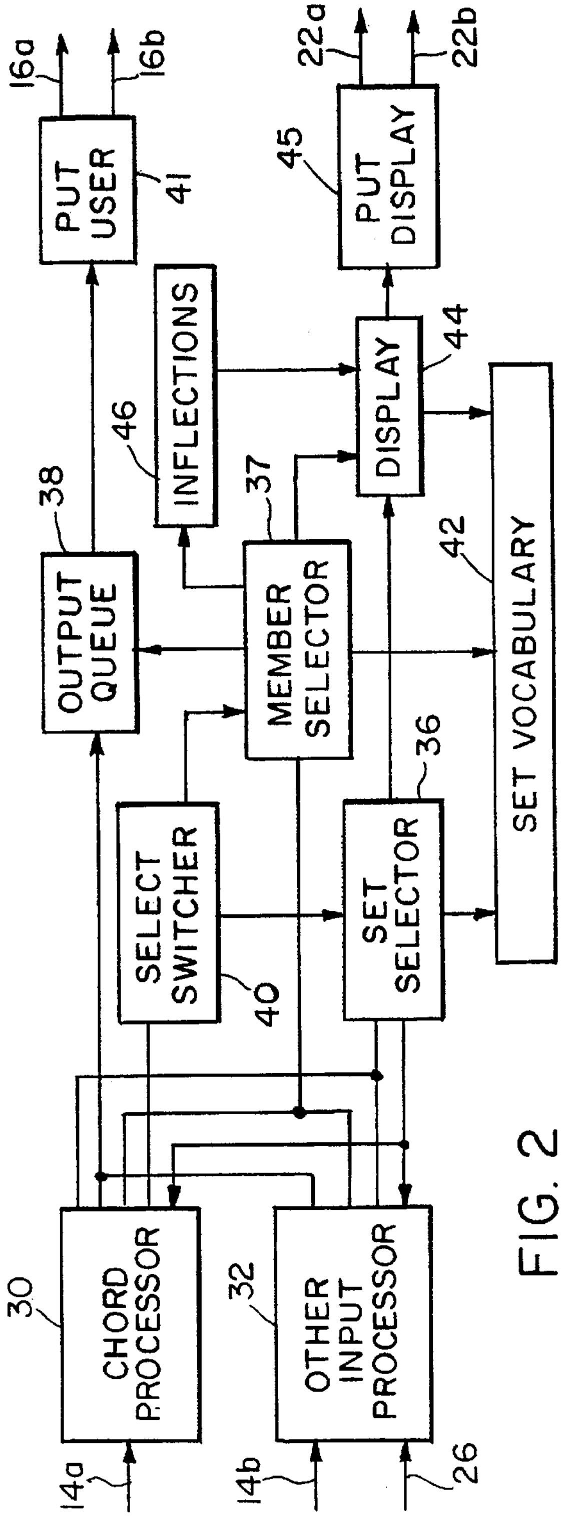
FIG. 2

```
static char *se_es_plurals[] = ("efi/iv", "fa/av", "fl/lv", "fr/rv", "hc/ch",
"hs/sh", "o/o", "s/s", "x/x", "z/z", " ");

static char *foreign_plurals[] = ("a/ae", "mu/a", "no/a", "is/es", "su/i", " ");

static char *se_ion_ive[] = ("br/rpt", "dd/ddit", "dne/ent", "dn/ndat",
"di/idat", "d/s", "eb/pt", "ecu/uct", "ede/ess", "edi/is", "edu/us", "ed/pt",
"eko/ocat", "em/mpt", "eni/inat", "eno/onat", "era/arat", "eriu/uisit""eri/irat",
"eru/urat", "ero/orat", "eso/osit", "esr/rsat", "ete/etit", "etuc/cut", "etut/tut",
"etu/utat", "eu/uat", "evie/ept", "evir/rivat", "evl/lut", "evr/rvat", "ez/zat",
"hsi/it", "lae/elat", "leb/bell", "le/uls", "ll/llat", "mr/rmat", "ngi/ignat",
"nia/enat", "red/derat", "ret/trat", "te/etat", "tib/bit", "tid/dit", "tim/miss",
"tio/oitat", "tnev/vent", "tn/ntat", "tr/rtat", "tsef/festat", "xa/axat", "yf/ficat",
"ylp/plicat", "yp/pat", " ");

static char *se_ate[] = ("a/", "reb/br", "reg/gr", "ylp/plic", " ");

static char *se_ce_cy[] = ("et/", "t/", " ");

static char *se_ly[] = ("y/i", "eu/u", "el/", "ll/l", " ");

static char *se_ous[] = ("a/e", "dn/nti", "ec/ci", "ega/age", "el/ul", "f/v",
"lev/vel", "th/hte", "tr/rte", "yn/ni", "yr/ri", "yt/te", " ");

static char *se_al[] = ("ecn/nti", "ec/ci", "el/ular", "esn/nsu", "eta/",
"hc/chi", "ne/in", "reg/geri", "ret/tr", "rot/tori", "tc/ctu", "te/etu",
"ti/itu", "tnedis/sidenti", "tp/ptu", "x/xu", " ");

static char *se_ic[] = ("a/at", "el/olic", "esp/pt", "esy/yt", "eta/act",
"me/emat", "sis/t", "xa/act", "yg/get", "yhc/ch", "yhp/ph", "yh/het", "yr/r",
"yx/ct", " ");

static char *se_ment[] = ("egd/dg", "eu/u", "mr/rma", "nru/urna",
"rep/pera", "tse/esta", " ");

static char *se_ant_ent[] = ("dne/ende", "di/ida", "dr/rda", "ecs/sce",
"ediu/uida", "edi/ide", "eg/ge", "el/la", "ero/ora", "eru/ura", "eu/ua",
"evr/rva", "fe/efia", "f/va", "mr/rma", "nia/enfa", "rae/eara", "reb/bra",
"red/dra", "ref/fere", "reh/hera", "rett/ttera", "ret/tra", "revi/ivera",
"rev/vere", "ru/urre", "ti/ita", "tp/pta", "tr/rta", "ts/ste", "wo/owa",
"yfi/ifica", "yl/lia", "ylp/plica", " ");
```

FIG. 3A

```
static char *se_ble_bly[] = ("cu/uci", "ed/si", "ecr/rci", "eca/acea",
"esno/onsi", "esr/rsi", "ss/ssi", "tp/pti", "ts/sti", "xa/axa", "xe/exi",
"yre/era", "yro/ora", " ");

static char *se_ity[] = ("el/il", " ");
```

FIG. 3B

| LEFT HAND FINGERS | | | | | REF. KEY | RIGHT HAND FINGERS | | | | |
|---|---|---|---|---|---|---|---|---|---|---|
| Lit. | Ring | Mid | Index | Index Reach | | Index Reach | Index | Mid. | Ring | Lit. |
| S5 S1 | S6 S2 | S7 S3 | S8 S4 | *RK | Index Reach | S8 *RK | S7 S4 | S3 | S6 S2 | S5 S1 |
| S5 S1 | S6 S2 | S7 S3 | *RK | S8 S4 | Index | S8 S4 | *RK | S7 S3 | S6 S2 | S5 S1 |
| S5 S1 | S6 S2 | *RK | S7 S3 | S8 S4 | Middle | S8 S4 | S7 S3 | *RK | S6 S2 | S5 S1 |
| S5 S1 | *RK | S6 S2 | S7 S3 | S8 S4 | Ring | S8 S4 | S7 S3 | S6 S2 | *RK | S5 S1 |
| *RK | S5 S1 | S6 S2 | S7 S3 | S8 S4 | Little | S8 S4 | S7 S3 | S6 S2 | S5 S1 | *RK |

FIG. 6

| LEFT HAND FINGERS | | | | | REF. KEY | RIGHT HAND FINGERS | | | | |
|---|---|---|---|---|---|---|---|---|---|---|
| Lit. | Ring | Mid | Index | Index Reach | | Index Reach | Index | Mid. | Ring | Lit. |
| C1 | C2 | C3 | C4 | *RK | Index Reach | *RK | C4 | C3 | C2 | C1 |
| C1 | C2 | C3 | *RK | C4 | Index | C4 | *RK | C3 | C2 | C1 |
| C1 | C2 | *RK | C3 | C4 | Middle | C4 | C3 | *RK | C2 | C1 |
| C1 | *RK | C2 | C3 | C4 | Ring | C4 | C3 | C2 | *RK | C1 |
| *RK | C1 | C2 | C3 | C4 | Little | C4 | C3 | C2 | C1 | *RK |

FIG. 7

WORD BASED TEXT PRODUCING SYSTEM

This application is a continuation-in-part of now abandoned U.S. patent application Ser. No. 07/440,994 filed Nov. 22, 1989 which is a continuation-in-part of now abandoned U.S. patent applications Ser. No. 07/392,727 filed Aug. 11, 1989 and Ser. No. 07/288,011 filed Dec. 21, 1988, now abandoned, the parents being included herein by reference.

MICROFICHE APPENDIX

The Microfiche Appendix, comprising 2 microfiche with a total of 107 frames, lists C source code and assembly language sections for programs to implement embodiments of the invention discribed herein.

BACKGROUND OF THE INVENTION

1. Field of the Invention

The present invention is directed generally to improvements in systems to input text to applications with computers and the like and particularly to systems which require less input data than that contained in the words themselves.

The invention systems include embodiments responsive to inputs from keyboards and others to inputs from non-keyboard apparatus such as pens, touch sensative screens, mice, etc. Some keyboard embodiments use both key actuation and key release inputs and others only inputs from key actuations as represented either by scan codes or character codes. Non-keyboard inputs can be handwritten characters, positions touched, and strokes of force, motion, or position.

2. Discussion of the Prior Art

The following includes art cited by the Patent Office in actions on the parent applications and art previously discussed in the parents. It is included as background although much is not pertinent to the present case.

CHORD TYPING SYSTEMS:

Stenograph systems registered combinations of key actuations on a paper tape and advanced the tape when all keys had been released. Typewriter systems used shift keys to change the characters outputted by other keys operated at the same time. The subsequent art is replete with systems using chords, or key combinations, of various types to improve the typing of text in one way or another. Some examples of different types of chording systems for text typing follow:

MECHANICAL TYPEWRITER WORD TYPING:

Bullock, U.S. Pat. No. 1,275,657, added keys to a typewriter to type words.

Seiber, U.S. Pat. No. 2,717,686, added a special shift key so other keys typed words when operated with it.

Schaefer, U.S. Pat. No. 3,289,804, typed words with keys depressed beyond their normal range.

STENOGRAPHIC KEYBOARD WORD/TEXT TYPING:

Balston, U.S. Pat. No. 1,590,998, suggests, but does not implement, the selection of a set of words with one key followed by the selection of a word from the set with another key. The word sets include sets of words with a particular suffix or inflected form.

Baisch, U.S. Pat. No. 3,558,820, attempts a system for producing text from stenographic type inputs with an enlarged keyboard that includes keys added for words, prefixes and suffixes.

Ayres, U.S. Pat. No. 3,225,883, Wright, U.S. Pat. No. 3,557,927, Binenbaum, U.S. Pat. No. 3,597,538, Budworth et. al., U.S. Pat. No. 3,892,915, and Lefler, U.S. Pat. No. 4,765,764, are examples of systems that produce text from stenographic inputs.

ONE HAND CHORD TYPING:

Bequaert et. al., U.S. Pat. No. 4,042,777, produces both words and characters from chords determined by detection of First Released Keys or All Released Keys.

Eilam et. al., U.S. Pat. No. 4,833,446, Enfield, U.S. Pat. No. 4,442,506, Densen, U.S. Pat. No. 4,836,700, are other examples of one handed typing systems.

TELEPHONE KEYBOARD ALPHABETIC CHARACTER TYPING:

Hilborne et. al., U.S. Pat. No. 3,833,765, Knowlton, U.S. Pat. No. 3,967,273, Prame, U.S. Pat. No. 4,344,069, and Whitaker, U.S. Pat. No. 4,490,056 produce character outputs from sequential operations of more than one key.

TIMING OF KEY OPERATIONS FOR CHORDS:

Rollhaus et. al., U.S. Pat. Nos. 4,638,306 & 4,674,280, and Goldwasser, U.S. Pat. No. 4,891,786, use the time intervals between operations of key combinations to distinguish chords.

ABBREVIATED TYPING OF WORDS:

Arellano et. al. "Word Generation System for Typists", IBM Technical Disclosure Bulletin, Vol 17, No. 8, January 1975, describes a system which generates the final portions of words after the typing of strings of first letters.

Todd, "Abbreviated Typing for Word Processing", IBM Technical Disclosure Bulletin, Vol. 21, No. 9, February 1979, generates words in response to the typing of abbreviations of the words.

Venema, U.S. Pat. No. 4,893,238, Levin, U.S. Pat. No. 4,760,528, Howell et. al., U.S. Pat. No. 4,459,049, and Goldwasser, U.S. Pat. No. 4,891,786, also use abbreviations to type words.

DISPLAYS OF KEYBOARD FUNCTIONS:

Knowlton, U.S. Pat. No. 3,879,722, provides an optical means to impose images from a CRT screen to a keyboard.

Buric et. al, U.S. Pat. No. 4,333,097, in a system using multiple sets of functions for keys, responds to key operations with a display of the resulting new set of key functions on a keyboard map.

Eibner, U.S. Pat. No. 4,425,627, displays functions responsive to function key operations.

Pick, U.S. Pat. No. 4,185,282, displays a keyboard map of key assignments for different languages.

Goldwasser, U.S. Pat. No. 4,891,786, displays words associated with keys on a keyboard map. The set of words displayed changes in response to key operations to show the words available from the next stroke.

WORD & SUFFIX TYPING:

Chang, IBM Technical Disclosure Bulletin, Vol. 22, No. 6, Nov. 1979 teaches the typing of words from standard keys and the space bar.

Hayashi et. al., U.S. Pat. No. 4,396,992, type words from keys preceded by the space bar and suffixes from keys preceded by letters, all if followed by a special key.

Hanft et. al. U.S. Pat. Nos. 4,374,625 & 4,464,070, type suffixes from keys with the suffixes depending upon the preceding string of characters typed.

Goldwasser, U.S. Pat. No. 4,891,786, uses the '/' key in combination with other keys to type suffixes appended with spelling changes when necessary.

IDEOGRAPHIC TYPING:

Tzu-Hung Li, U.S. Pat. No. 3,950,734, divides Chinese characters into a prefix and a suffix related to one of 10 primary character elements. The 10 prefixes and the 10 suffixes are further divided into 100 divisions. A 100 key keyboard then provides for typing prefix and suffix combinations in two strokes to specify the Chinese characters.

Wang Young-Min, U.S. Pat. No. 4,684,926, arranges selected roots on 25 keys of a standard keyboard to obtain Chinese characters.

Andrew Chui, U.S. Pat. No. 4,689,743, encodes Chinese characters by basic stroke elements and sequences and then orders characters having the same codes by the degree of complexity.

OTHER SYSTEMS:

The article, "Multilingual Word Processing", Joseph. D. Becker, in the Scientific American of July 1984, discusses some of the difficulties inherent in typing the large number of characters of ideographic languages and describes a phonetic conversion system presently in use to type Japanese. In this system, the user types words in a phonetic alphabet to computer apparatus which searches a dictionary to find the words having the input sound strings. The sound strings are frequently matched by more than one word and the user then makes additional inputs to select the word wanted from those matched.

Most of the foregoing systems combine chord typing with regular typing. Goldwasser and Rollhaus et. al., for example, use the time intervals between key operations to distinguish those for chords from those for regular typing. Arellano et. al. Todd, Chang, Hayashi et. al., Venema, and Goldwasser, use dedicated strings or special keys to mark inputs for words.

Byte, published by McGraw Hill, articles titled "The Point of the Pen" and "Touch and Feel Interfaces", pgs 221–226, of the February 1991 issue and "NCR Knows Notepads", pgs 37–38, of the August 1991 issue discuss Pen and other non-keyboard input systems.

SUMMARY OF THE INVENTION

The overall objective of the present invention is a better way to produce the text of any language for any computer type application responsive to inputs from keyboards or from non-keyboard apparatus.

An objective of the present invention are systems which enable display assisted users to produce nearly all of the words of any language with a minimum amount of input information.

Another objective of the present invention are systems of the aforementioned type which literate persons can almost immediately use to produce text.

Still another objective of the present invention are systems of the aforementioned type which use keyboard inputs and which enable typists to type easier and faster.

Yet another objective of the present invention are systems of the aforementioned type which use keyboard inputs and which enable very high typing speeds.

A further objective of the present invention are systems of the aforementioned type which use non-keyboard inputs and which enable rapid and easy input of text by persons without keyboard skills.

A further objective still of the present invention is a pen system for rapid and easy input of text and/or other data for any application.

Still further objectives of the instant invention will become apparent from the following description and claims.

Present invention system user inputs guided by displays select sets of word stems, select word stems from selected sets, apply inflections to selected word stems, and append endings to selected word stems to produce word text. The word stems come from a system vocabulary responsive either to inputs from keyboards or non-keyboard apparatus. System vocabularies can cover a language for text documents or cover only a small set of words for particular applications. Language vocabularies hold sets of word stems, each with text data and, in the case of inflected languages, also with data for inflected forms. The word stems of each set share one or more attributes whose inputs select the set. Single attributes get the most frequently used word sets, more attributes get successively less frequent sets.

Possible attributes include elements or characters that apply, or are part of, all set members. The attributes used for word sets depend on the language and on potential users. In the case of alphabetic languages, starting letter strings of wanted words are known by writers so various lengths of letters strings serve nicely as sets of attributes. Inputs of strings of letters with no set assigned can produce words not in the system vocabulary. Any language could substitute phonetic sounds for letters as attributes. Non-alphabetic languages may supplement or replace phonetic sounds with components or parameters of text characters that users of the language know and easily associate with words. Some languages may find parts of speech useful as additional attributes. All languages include a set of words whose only shared attribute is very frequent use.

On word starts, a display shows a set of the most frequently used words and indicates the inputs to select the words. The inputs may also select attributes which in turn select the next most frequent word sets. For position inputs, the display has the items spread out for easy touch selection. In the case of keyboard models, the display shows the words mapped on a keyboard to associate with the keys which select them. The display may include key characters to assist typists. For stroke inputs, the display presents the words and attributes positioned about a center. Directions from the center correspond to those of stroke directions for selection. Each selection advances the display to the next set to continue its guidance.

Users should quickly learn the inputs for the most frequent words and first set attributes to save time in looking at the display. They can then dispense with the display for word starts. Few users will learn the inputs for all of the words of a language, however, and the display will continue to be necessary for sets of less frequent words. Users will also learn the set of inflections and endings and so might also dispense with their display. The reduction of word writing system display requirements after learning may be important for some applications. The display makes the present invention system practical for learning and for large numbers of words.

The general logic of the present invention systems has the first input selecting a word and an attribute which in turn selects a first set of words. The second input may output the selected word; may apply an inflection or ending to the selected word; or may select both a word from the first set and a second attribute. The combination of the second attribute and the first attribute inputted selects a next set of words. Output of selected words, with or without inflections and/or endings added, sets up new word starts. Successive inputs for wanted words continue to select new words and sets as long as the vocabulary has sets assigned to the string of attributes inputted. (In the case of alphabetic languages, when there are no sets, the system outputs the string of letter attributes inputted.)

Embodiments, herein referred to as chord models, have keyboards which signal key actuations and releases use first key actuations to select words and sets. Release of first keys before actuation of other keys outputs the selected words. Actuation and release of other hand keys before first key release selects members of selected sets. The selection of a member enables other hand keys for stem inflections. Actuation and release of keys in order with typing overlaps select successive words and attributes to select successive sets. Satellite key features use two keys operated at the same time by either hand to select more sets or inflections. Each hand can operate two keys to single chord type many words.

Embodiments, herein referred to as actuate only models, use either key actuation or character signals as inputs. The inputs select pairs of items as do the first keys on chord models. The pair on word starts are MFWs and first key sets as on chord models. Next letter key actuations get a letter and either a word or an inflection to apply to the previously selected word. Space Bar operation outputs the selected word, MFWs or other, with any inflections applied, and adds a 'Space'. Punctuation key operations also output the selected word and append a Punctuation String. The 'Tab' key enables the selected word to be compounded with the next word or a regularly typed suffix. The 'Enter' key enables the letter string to be a prefix or a word.

Pen input systems with recognition of handwritten characters could replace key actuate or character inputs to actuate only models. The present invention systems include as an alternative a stroke input system for word writing and other applications. The strokes of this system consist of motion, or force, patterns that are much easier for users to execute and programs to recognize than handwriting. Display of stroke assignments about a reference associate them with stroke directions. Stroke inputs can more or less directly replace key inputs and pen lifts the Space Bar in actuate only models. Pen lifts allow relocation after meandering movements for successive strokes and further allows the use of starting positions as inputs to an executive set.

The present invention stroke input system not only replaces the keyboard in actuate only models but also enables word writing models not limited by keyboard and typing compatibility considerations. The starting position executive set provides quick access to more than one word start set and/or to special vocabularies. Other hand key operations can combine with strokes in hybrd chords or select alternate assignment sets. Keys could select endings for stroke or touch selected words. Joysticks and any other means to sense motion or force of fingers or thumb can provide stroke inputs instead of pens.

The present word writing system is perhaps the most demanding application for stroke input systems. Those skilled in the art will recognize that the present stroke input system has other applications in which it is an improvement over prior means for making inputs related to displayed items. In many prior applications, users select displayed items by moving a mouse until the mouse pointer reaches the item and then clicking a mouse button. The present stroke input system allow the user to get the same item with a small motion. Pens can combine with auxiliary switches and even keyboards. Pens can include functions like those of a mouse, relocating displayed items, etc.

The present invention word writing system minimizes the inputs required for text production and guides beginners and other users to inputs for any wanted word in a language. The system can include and similarly get words from smaller vocabularies of technical or custom terms for particular users. The system can also access words for other uses, such dictionary look up and other data bases. Touch input models are easiest where speed is not important. Chord models with the Satellite Key features offer maximum speed for those who develop new skills. Actuate only models mostly use existing typing skills and so are easier for typists to learn. Stroke models provide word writing functions for non-keyboard users and offer a common interface to word writing, word processors, operating systems, and other programs. Stroke input systems offer advantages for applications other than word writing.

DESCRIPTION OF THE DRAWINGS

The aforegoing and other objects, features, and advantages of the invention will be apparent from the following descriptions of preferred embodiments of the invention illustrated in the accompanying drawings.

FIG. 1 is a functional block diagram of embodiments of the present invention system.

FIG. 2 is a more detailed functional block diagram of the word producing system block of FIG. 1.

FIGS. 3A and 3B show arrays for English language modifications to word stem endings and inflections.

FIG. 6 shows the patterns of Satellite Keys for sequential operations that relate to Reference Keys in the different row positions.

FIG. 7 shows the patterns of Satellite Keys for operations in combination that relate to Reference Keys in the different row positions.

DESCRIPTION OF THE PREFERRED EMBODIMENTS

Figure 4:
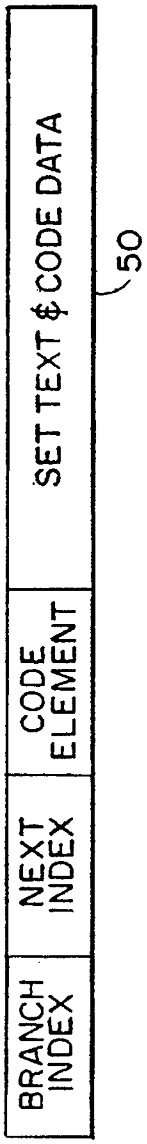
FIG. 4 is a diagram of a word set packet for a set vocabulary.

FIG. 1 is a general block diagram of modules for instant invention system embodiments. Keyboard 11, which may include a built-in microprocessor, produces key actuate and key release code signal outputs. The key signals go to hardware specific interface 12. Keyboard 11, interface 12, and user keyboard interface 17 may be part of a host computer. Interface 12 normally passes the key signals along on line 13 to interface 17 which translates them to character signals. Interface 17 then supplies the character signals to host computer user systems 18 in response to requests for keyboard services.

As modified for some embodiments of the present invention systems, interface 12 supplies the key signals on line 14*a* to word producing system 15. Interface 17 receives key or character signals on line 16*a* from system 15. In other embodiments, interface 17 outputs translated character signals on line 14*b* to word producing system 15 which then outputs character signals on line 16*b* to user systems 18 in answer requests for keyboard services. Word producing system 15, the main program module for the present invention system, in one embodiment handles key signals from keyboard 11 and the second embodiment handles key character signals.

User systems 18 consist of devices or programs which request keyboard services and use the key characters and other data derived from key operations by interface 17 or word producing system 15. User systems 18 supplies data for display via line 19 to user display interface 20 which passes it along to display system 21. User display interface 20 and display system 21 also normally part of the host computer, present the text and other data from user systems 18 on the computer screen. If these units have a multiple window capability, system 15 also supplies data for display via line 22*a* to interface 20. Display system 21 then presents the user systems 18 data in one window and the system 15 data in another. Otherwise, auxiliary display 23 receives the system 15 data via line 22*b*.

Other input systems 25 supplies input signals via line 26 to word producing system 15. Other input systems 25 may include various types of non-keyboard apparatus such as a Pen or a Mouse, a touch sensative screen, a Joystick, etc. A Pen input system with hand written character recognition or a virtual keyboard can produce outputs to substitute for keyboard signals. A new stroke input system for systems 25 produces inputs for word production in response to movement or force patterns much simpler than those letters. Touch responsive screens for displays 21 or 23 would allow fingers or pens to make inputs by touching displayed words and other items. Systems 25 encompasses a range of alternatives to keyboard 11 and interfaces 12 and 17 for inputting to word producing system 15.

Keyboard 11 signals both key actuations and releases to hardware specific interface 12 in some embodiments and only key actuations in others. Interface 12 includes the apparatus and/or software necessary to supply the key signals via line 13 to user keyboard interface 17 and/or via line 14*a* to word producing system 15. As previously mentioned, interface 12 will generally be a modified version of the host computer hardware and software which normally handles key signals from keyboard 11. Word producing system 15 responds to inputs on line 14*a* with outputs on line 16*a* to user keyboard interface 17.

User keyboard interface 17 consists of the software routines, such as those of host computer operating systems, that handle keyboard services. In the case of the IBM Personal Computer, such routines are in the system BIOS. These routines translate key scan codes, store shift status, produce character code outputs, answer requests for services, etc. Interface 17 translates key signals received on line 16*a*, as it does those direct from keyboard 11 on line 13. If word producing system 15 outputs on line 16*a* are character signals, interface 17 passes them along to user systems 18 as part of its keyboard services. In other embodiments, interface 17 instead outputs character signals, derived from line 13 key signals, on line 14*b* to system 15.

Word producing system 15 responds to the inputs on lines 14*a* and 26 with character signal outputs on line 16*b* to user systems 18 to directly answer requests for input characters. The several embodiments of word producing system 15 consist of program modules which could run on a microprocessor but generally run on the host computer. In the case of an IBM Personal Computer running MS DOS, word producing system 15 would be installed with the MS DOS Terminate but Stay Resident Service to be available to the other programs. Those skilled in the art will be able to similarly install word producing system 15 on computer systems other than IBM Personal Computers.

FIG. 2 is a more detailed functional block diagram of embodiments of the word producing system 15 of FIG. 1. Key signals on line 14*a* from keyboard 11 via interface 12 go to chord processor 30. Keyboard character signals on line 14*b* and other signals on line 26 from other input systems 25 go to other input processor 32. Embodiments can have either a keyboard 11 or other input systems 25 or both. Processors 30 and 32, present when their respective input signal sources are included, apply signals to set selector 36, member selector 37, and output queue 38. Chord processor 30 further produces signals to select switcher 40.

Set selector 36 uses its input signals to select sets of words from set vocabulary 42. Member selector 37 uses first input signals to select words from the selected sets and successive inputs to apply inflections and other endings to the selected words. Member selector 37 outputs the resulting text to output queue 38. Put user 41 outputs the contents of output queue 38 via line 16*a* to user keyboard interface 17 or via line 16*b* to user systems 18. Chord processor 30 signals select switcher 40 when succeeding inputs require changes in previous actions. Switcher 40 in turn signals set and member selectors 36 and 37 to make the changes.

Set selector 36 responds to inputs from chord processor 30 and select switcher 40 and from other input processor 32 for set selection. Selector 36 searches set vocabulary 42 to find the word sets assigned to the inputs. The most frequent sets are assigned single inputs and others to strings of two or more inputs. The searches are similar to those of parent applications except that the target items are sets of words rather than individual words. Vocabulary 42 holds sets of words assigned to inputs and input strings, much like parent application vocabularies held words. The searches will be described in more detail later.

When set selector 36 finds a set, it supplies a pointer to the set to member selector 37 and to display 44. Member selector 37 and display 44 use the set pointer to work with the selected set. Display 44 gets the set data for display to assist users in finding wanted words. Member selector 37 gets the members of selected sets called for by first inputs and holds them for inflections and endings and/or output. Put display 45 copies the text and other parts of the set from display 44 to display system 21 or auxiliary display 23 via line 22*a* or line 22*b*. If set selector 36 can find no set assigned to the inputs received, it sends a No Set signal to processors 30 and 32.

The inputs to member selector 37 for members indicate the member numbers in the sets. Member selector 37 counts the members from the set start pointed to by the set pointer to find the number members. The words in the sets ends with bytes having their high bit set to facilitate word counting. The other bits of the end byte represent an sic_code that specifies a set of inflections and other possible endings for the word. Some words further include text codes for inflections that require additional information to be properly applied. Member selector 37 stores the word text for inflection and/or output and copies the inflection and endings data to display 44.

When set selector 36 selected a set, display 44 copied data for the word set display, as previously mentioned, to guide users to inputs for members. When member selector 37 selects a member, it supplies member data to display 44 and inflections 46 for the set of inflections and any other inflections specified by text codes. Put display 45 copies the data from display 44 via line 22*a* or line 22*b* to display systems 21 or auxiliary display 23. The resulting display guides the user to the inputs to obtain the inflections and endings for selected words.

Member selector 37 receives second inputs for the application of inflections and word endings to the selected members from processors 30 and 32. Selector 37 responds with calls to inflections 46. Inflections 46 uses the inflections and endings member data previously received along with built in data and rules to apply the inflections selected to the word members stored by member selector 37. For English, inflections include irregular ones which change the word spelling and others which append suffixes with or without spelling changes. Word endings further include punctuation strings and set up of compounding of next words.

Upon the receipt of word ending inputs, member selector 37 copies the selected word, with or without inflections applied or endings added, to output queue 38. For the alphabetic languages, some embodiments have the words of the sets in set vocabulary 42 without the starting letter strings to which the sets are assigned. Display 44 and member selector 37 then obtain these letters from set selector 36. No Set signals produced by set selector 36 and non-letter inputs cause processors 30 and 32 to signal member selector 37 to transfer input strings to queue 38 and to pass subsequent inputs directly to queue 38.

With the system ready for the start of a new word, such as after a word or 'Space' output, processors 30 and 32 signals set selector 36 to select a most frequently used word (MFW) set. If the MFW Display is On, selector 36 also signals display 44 to present the MFWs, usually with the set of attributes used for other set selections. (The MFW Display is primarily for beginners and users who know the sets may turn it off.) Some MFWs include the attribues associated with them for selection and others do not. An example of a MFW set for English mapped to a keyboard follows in Table A.

TABLE A

EXAMPLE OF MFW SET FOR ENGLISH

| | | | | | | | | | |
|---|---|---|---|---|---|---|---|---|---|
| one | two | three | four | five | six | seven | eight | nine | ten |
| with | was | as | at | to | you | I | in | of | on |
| a | is | had | for | have | he | the | that | it | and |
| are | she | but | by | be | not | his | this | from | or |

MFW Displays, not shown, present the words of Table A and may also include the characters of the associated keys to supplement the positional relations for typists. Keys in some embodiments may select first key sets with attributes other than those of the key characters. The MFW Display may include such first set attributes or they may simply be presented in the User Manual. Most embodiments will only use the letters of letter keys as attributes for set selection after the first sets to minimize learning for typists. Exceptions to this rule for the first sets has the objective of accessing more very frequent word sets with first inputs.

Key actuation and release models output selected MFWs upon release of word start keys before actuation of another key. Holding word start keys operated enables the other hand keys to select members from the selected set. The holding also enables adjacent same hand keys as Satellite keys with letter assignments for selection of additional sets, as will later be explained. Table B shows a display produced for the 'w' key as the word start key. Table B shows the selected MFW "WAS", and the reference key 'W' captalized to indicate highlighting. Satellite key letter assignments adjacent to the 'W' and the set of 14 word stems assigned to the other hand keys complete the presentation.

TABLE B

DISPLAY FOR 'w' KEY AS CHORD WORD START

| | | | | | | | | | |
|---|---|---|---|---|---|---|---|---|---|
| | WAS | | | | | | | | |
| a | W | e | i | o | want | war | water | way | — |
| — | — | — | — | — | we | week | well | went | were |
| — | — | — | — | — | will | woman | work | world | would |

Upon release of the 'w' key before another actuation, processor 30 signals member selector 37 to output "was". Else processor 30 responds to other hand keys with signals to member selector 37 to change from "was" to the word shown by Table B as assigned to the actuated key. In the case of the 'o' key, the newly selected word is "way". Release of the other hand key, the 'o' key, before the 'w' key sets up "way" as the newly selected word for output in place of "was" upon release of the 'w' key. Release of the 'w' key before the 'o' key, however, causes processor 30 to signal set selector 36 to get the set assigned to the letters 'wo'. The display changes to present "WAY", 'O' and the 'wo' set as shown in Table C.

TABLE C

DISPLAY FOR 'wo' TWO KEY CHORD SET

| | | | | | | | |
|---|---|---|---|---|---|---|---|
| | | | | WAY | | | |
| woman q | wonder w | word e | wore r | l | m | n | O |
| wood a | workshop s | worry d | | | | | |
| worse z | worship x | worst c | wound v | | | | |

The Table C display pattern is a mirror image of the Table B display pattern. Other right hand last set select keys get the Table C pattern while other left hand last set select keys get the Table B pattern. The action for the Table C pattern is similar to that just described for Table B. Release of the 'o' key before actuation of another key outputs "way", the selected member of the last set. A left hand key, such as 'r', actuated before release of the 'o' key, selects a member of the 'wo' set and a new set, such as the 'wor' set. Chord processor 30 actions for satellite and other same hand keys remain to be described later.

Like the word start inputs to chord processor 30, a word start input on either line **14*b* or line 26 select both a word from the MFW set and an attribute which in turn selects a set of words. Processor 32, as previously mentioned, signals member selector 37 for the MFW and selector 36 for the set. Unlike the chord embodiment and like the MFW Display, displays for the newly selected word sets can use the full width of the screen. This allows larger words sets than those for chord embodiments. Following signals on lines 14*b* and 26 successsively select new members and sets. Space bar signals on line 14*b* and a pen lift signals on line 26 via processor 32 and member selector 37** output selected MFWs and other members.

In all embodiments, successive set selection ends when set selector 36 finds no assigned sets for the inputted string in set vocabulary 42. Set selector 36 then produces a No Set signal to processors 30 and 32 for output of the previously inputted string. Processors 30 and 32 output following input characters as long as the No Set condition prevails. Keyboard models reset the No Set condition by operation of the Space Bar which also terminates the string with a 'Space'. The Space Bar also outputs selected words in key actuation or key character models. Pen models use the same pen lift or auxiliary signal to both output selected words and the reset the No Set condition.

All embodiments in the present case use the same type of set selector 36 and set vocabulary 42 differing only the size of the sets. Set vocabulary 42 stores sets of word stems, much as the vocabularies of parent cases stored single word stems and selector 36 accesses the sets, much as the parent case accessed the single word stems. The set packets 50 of FIG. 4 in the present case differ from the word packets of FIG. 4 of the parent case in that they hold text and inflection code data for each of the plurality of word stems in the set rather than for just one. Present case FIG. 4 packets further include Next Indexes for jumps to the next packet 50 in the chain and use two byte Branch Indexes for longer jumps to next branches.

Figure 5:
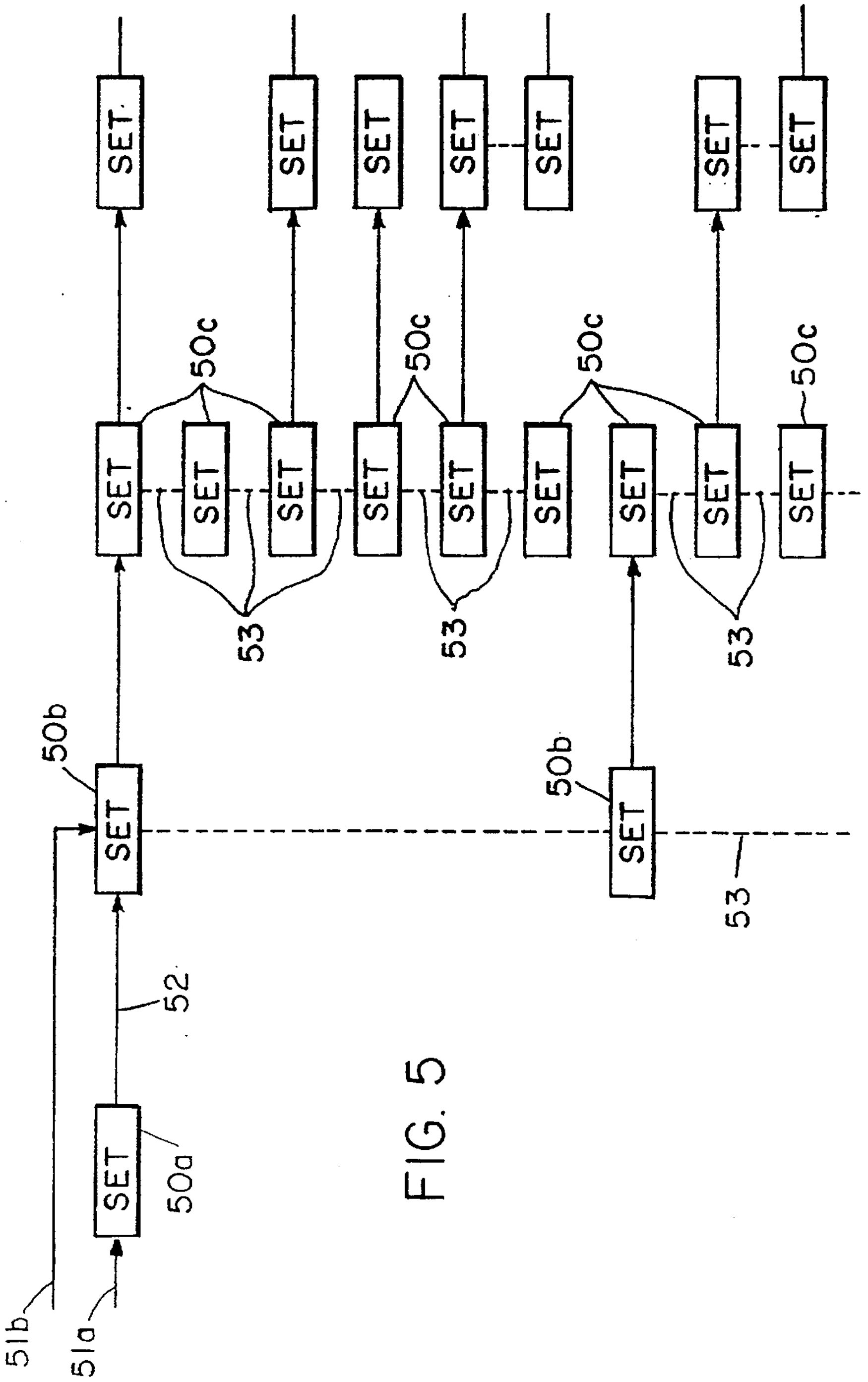
FIG. 5 is a partial block diagram of an arrangement of word set packets in a set vocabulary.

The FIG. 5 arrangement of set packets 50 for a fragmentary section of vocabulary 42 is the same as that of FIG. 5 of the parent case. Only the contents of the packets differ. The search for sets in this case can thus be substantially the same as that for words in the parent case. The present case searches are somewhat more efficient as the new Next Indexes avoid having to scan through text and code to the next packet 50 in a chain and the larger Branch Indexes eliminate the need for intermediate jumps to reach Next Branches.

On word starts, set selector 36 uses the first set select attribute inputted to access pointers to the line 51 a inputs to the packets 50*a* which hold the first sets. (As they are reached by pointer, the set packets 50*a* do not require code elements or Branch Indexes.) Set selector 36 copies the pointers to member selector 37 and display 44 for possible actions on the sets and also stores them for the start of searches called for by subsequent inputs. A second set select input causes selector 36 to jump via line 52 by the 'Next Index' to the following packet 50*b*. After the jump, selector 36 compares the second attribute inputted with the 'Code Element' of the packet 50*b*. If the 'Code Element' does not match the second attribute, selector 36 continues the search by using the packet 50*b* 'Branch Index' to jump to the packet 50*b* in the next branch. Selector 36 continues to jump and compare until it finds a packet 50*b* with a 'Code Element' that matches the second attribute or until there are no more branches.

The packet 50*b* with a matching 'Code Element' holds the selected set. Set selector 36 copies the address of the packet 50*b* to member selector 37 and display 44 and stores it as the new set pointer. If set selector 36 instead finds that there are no matches before there are no more branches, perhaps as indicated by a Branch Index of 0, processor 30 discontinues further searching. Models for alphabetic languages use letters as set select inputs and set selector 36 store them for output them on word ending inputs or on receipt of the next non-letter input.

Processors 30 and 32 input subsequent attributes to set selector 36 for subsequent set selections. The set select actions for the subsequent attributes is much the same as that just described for second attributes. Selector 36 returns to the packet 50*b* through 50*d* with the last selected set to start the search for the next set assigned to the attribute string with the added attribute. Selector 36 again uses the 'Next Index' of the last set packet 50*b* or 50*d* to jump to the next packet 50*c* or 50*d* respectively and again looks for the 'Code Element' to match the next letter or other attribute. The Next Index is 0 when there are no more next packets 50 for the resulting string.

The set text data of packets 50*a* through 50*d* of system vocabulary 42 includes the member text, or the remaining text if, as for alphabetic languages, the set select inputs are part of the member text. In the latter case, processors 30 or 32 or set selector 36 supply the starting letters. The text data for each member includes one or more bytes which mark the member end and serve as a stem inflection code, or sic_code. The member text data may also include one or more text codes for irregular inflections. The text data may further include row and set end markers to assist member selector 37 in finding members and display 44 in presenting them in the proper patterns.

As previously mentioned, stem inflection code bytes, or sic_codes, have high bits set to distinguish themselves and to mark the ends of stems. The sic_codes designate sets of inflections and optionally sets of related words. Members can additionally include text codes to specify irregular or infrequent inflections. Inflected forms can be members of word sets but most are produced by selecting member stems and inflections separately. The inflection sets specified can be either of two types. One includes only those for each stem which forms allowed words. The other is for types of stems and the sets may include some members not forming allowed words with all stems. Users then decide which inflections to use with each stem.

As previously described, the first inputs of all model types select both a member of a first set and a second set. After the first input, chord models use one type of input to select sets and another to select members. Non-chord models continue to select both a set and a member with each input. (The user's choice of inputs depend on whether a member or another set is wanted.) Upon chord model selection of a member, member selector 37 supplies the selected member code data to inflections 46. Inflections 46 in turn supplies display 44 with the data needed to present the set of inflections specified by the member data. Non-chord models may require an additional input to trigger the same actions for currently selected members.

As previously described, the different types of models use word sets of different sizes. The inflections and endings set sizes correspond to the word set sizes with one exception. The stem most frequent inflection sets for the Satellite keys of chord models, like the letter sets for Satellite key set selection, have only eight members. Chord models select members for output with one hand holding the last set select key while the other hand operates a key to select the member. The Satellite key inflection set is both enabled and displayed while the member key is held. Release of the member key switches to an inflections and endings End Set for all of the member hand keys.

In chord models, release of the set select key after release of the member key signals member selector 37 to output the selected word, with or without added inflections and/or endings, via output queue 38. Non-chord keyboard models signal selector 37 with Tab and Enter key inputs to set up other keys and the display for inflection and endings sets and with the Space Bar input to output words. Non-keyboard models signal selector 37 with a special stroke or auxiliary input to enable other strokes and set up the display for inflections and endings sets. Different speed strokes select inflections and endings without the display. Pen lifting or another auxiliary input outputs words.

Inflections 45 stores the inflection sets and other data necessary to display and apply inflections to stems. Selector 37 responds to member select inputs by getting the selected member text and code data from vocabulary 42 for use by inflections 46. Inflections 46 uses the sic_code to access an inflection set and supplements the set with inflections specified by text codes. Display 44 presents the resulting set. When inflections 46 receives an input via selector 37 for an inflection, it correlates the input with the set displayed to indentify the inflection selected. Inflections 46 then applies the selected inflection to the member text using its stored data for spelling rules and suffix stem end combinations.

FIGS. 3A and 3B show a set of arrays of modifications to stem ends and inflection suffixes. The microfiche appendix includes an updated set of arrays stored by inflections 46. As in the parent case, inflections 46 checks for an array for the selected inflection suffix. If there is one, inflections 46 scans the stem ends in the array for a match with the end of selected member held by member selector 37. If a match is found, inflections 46 joins the inflection suffix to the end of the member with the spelling as indicated by the modification. (The "*se_ion_ive" array has a large number of bridges for the "ion" and "ive" suffixes. The "*se_ant_ent" array supplies "a", "e", and other bridges for the "nt", "nce", and "ncy" suffixes. The "*se_ble_bly" array has the "i" bridge for "ble" and "bly". A default rule applies "a" before "ble" or "bly" for stem ends not in the array.)

If the selected inflection suffix does not have an array or if or the stem end is not in the suffix array, inflections 46 uses spelling rules of Table E to join selected members and inflection suffixes.

TABLE E

| SPELLING RULES FOR APPENDING SUFFIXES |
|---|
| If the selected suffix starts with a consonant, append it to the member text. |
| Else if the selected suffix starts with a vowel and the member ends as follows: |
| If a Final 'e'; |
| Drop the 'e'. |
| If a Final 'y' preceded by a consonant; |
| Change the 'y' to 'i'. |
| Exceptions: |
| If 'ing' is the suffix, |
| no change. |
| If 'ous' is the suffix, |
| change 'y' to 'e'. |
| If a final consonant preceded by a single vowel preceded by a consonant, |
| Double the final consonant. |
| Exception: |
| Multi-syllable member with accent not on last syllable. |

Note: As indicated by SIC with Non-Doubling bit set. An accent indicator would be a possible alternative.

The arrays and the Spelling Rules of Table E provide for the proper appending of most inflected forms. Others with unusual or variant spelling are specified by text codes. A text code with a stem can specify any spelling. Table F shows some examples of text codes used in one embodiment. Leading digits greater than 4 relate to member slots to be occupied by the following text code units. Digits equal or less than 4 preceding each text code letter string indicate the number of backspaces into the member end for start of the letter string. Text codes are efficient for supplementing standard sets with infrequent inflections and for spelling exceptions.

TABLE F

| TEXT CODE EXAMPLES | |
|---|---|
| 1891my1me | (For "I", "my", and "me".) |
| go952wentOne | (For "go", "went", and "gone".) |
| long73ength | (For "long" and "length".) |

As previously mentioned the stem inflection sets for chord model Satellite keys have eight members. Table G shows a default set of eight inflection suffixes which suffice for large numbers of word stems. Alternating other inflections for one or more members of the default set gets sets for most of the other stems. The sic_codes include the necessary data to specify the alternate members for types of stems and text codes spell out alternate members for some stems. The alternate inflections are placed in the upper row slots unless they relate to other slots. Irregular plural and past tense inflections, for example, better relate to the "s" and "ed" suffixes and so replace them.

TABLE G

| DEFAULT SET OF FREQUENTLY USED INFLECTIONS | | | |
|---|---|---|---|
| ness | est | er | ble |
| s | ed | ing | ly |

Table H shows most of the alternate inflections in groups according to the type of stem. Some adjectives replace 'ness' with 'ce', 'cy', or 'ity'. Many nouns have a "To Adjective" inflection and its cascade with 'ly', a have two, and some have other single inflections. Many verbs have "To Noun" and/or "To Adjective" inflections. Irregular verbs replace 'ed' with irregular past tenses and some have irregular past participles for an upper row slot.

TABLE H: DEFAULT REPLACEMENT INFLECTION SET MEMBERS

Adjective To Noun: ce, cy, ity, ness.
Adjective to Verb: ate, ize.
Noun To Adjective: al, ical, ful, less, ous.
Noun To Adverb: ally ically, fully, lessly, ously.
Noun To Noun: age, dom, ess, hood, ic, ism, ist, ship.
Verb To Noun: ion, merit, nice, ncy, er/or.
Verb To Adjective: ive, nt, ble.

Few English stems require more than eight slots G for their particular sets of inflections mostly from Tables G and H. All stems together, however, use all of the inflections of Tables G and H plus a few more. These more than fill the slots of a full keyboard or a 24 stroke Pen system. Like the eight slot Satellite key sets, at least some of the other key and stroke set slots will have to handle different inflections at different times. In some instances, the shift keys could expand the number of slots for the inflection and ending sets.

In chord models, member key release sets up the half keyboard End Set of Table I. The Table I End Set includes the eight Satellite key slots on four keys of each of the home and upper rows. The remaining keys of the Home and Upper rows and the keys of the digit row are filled in with other inflections. The lower row has three punctuation strings, a "CNCL" function and a "CPD" function.

TABLE I

| END SET | | | | |
|---|---|---|---|---|
| al | ic | ion | ive | ity |
| ness | est | er | ble | or |
| s | ed | ing | ly | POSS |
| CNCL. | CPD. | ,_STR. | ._STR. | ?_STR. |

The punctuation strings include the number of 'Space' characters that usually follow punctuation marks in sentences. Sentence ending punctuation strings further include a special character to automatically capitalize the next sentence start. Selection of a punctuation string signals member selector 37 to output the member followed by the punctuation string. The "Cpd" function eliminates the "Space" after a word to set up compounding whatever follows with the word. The "Cpd" function may also enable a set of words that frequently compounded to others, such as "man", "time", "thing", etc. When mistakes are made, the "Cncl" key can cancel the last member selected and any inflections added.

As the End Set does not include all of the punctuation, models have to include other means for other punctuation and non-text characters. Chord models have the Space Bar held to enable input of these other characters. Other special inputs set up the same sets for other models. As users have to shift concentration from word text to punctuation to select strings from the End Set, some may prefer to use the alternate means for all punctuation. End Set punctuation strings might be handled exculsively by the alternate means and the slots used for additional inflections.

Chord models include Satellite key shortcuts to extend and speed up both set and inflection selection. Actuation of first keys by either or both hand enables adjacent keys as Satellite keys. With first keys selecting sets, the Satellite keys input additional attributes to get more sets. With first keys selecting members, the Satellite keys input inflections for the selected member. The Satellite keys enable skilled users to input as much with single chords as with two, or even four, individual strokes. Some models require first and Satellite keys oprations in sequence. Others respond to any sequence. Sequential operation is necessary for display guidance while learning and for stems with unknown inflection sets.

FIG. 6 shows the patterns of Satellite and Reference keys of either hand in each row position. The row position column designations are the fingers which normally cover the positions in touch typing. S1 through S8 indicate the respective Satellite keys which get the same assignments from all rows. The assignments are either attributes from Table H or inflections from Table G. Except for Reference keys in the index finger positions, the fingers can cover the same keys as in regular touch typing. The middle finger takes the Reference key in the index finger position and covers the index finger position when the Reference key is in the index each position.

FIG. 7, like FIG. 6, shows patterns of Satellite and Reference Keys. The 'C1' through 'C8' designations of FIG. 7 indicate combination independent of the order of operation. The key combinations have to be unique and have the same assignments as the S1 through S8 sequential pairs of FIG. 6. The 'C5' through 'C8' labels apply to combinations of more than two keys consisting of two or more of the 'C1' through 'C4' keys with a Reference key. When operated in sequential order, Reference key first, the C1 through C4 keys get a display of the combination assignments to assist in learning. Higher speeds are presumeably possible for operations without regard to order.

Processor 30 and/or set selector 36 responds to actuation of first, or Satellite Reference, keys for set selection with inputs to display 44 for the Satellite key attribute assignments. The attributes are those which, in combination with the Reference key attribute, are most likely to select frequent sets. In the case of English, the attributes are letters and the most likely are consonant vowel or vowel consonant combinations. Upon operation of a Satellite Key, processor 30 signals set selector 36 to get another set from set vocabulary 42. If the Reference key is released first, select switcher 40 cancels the Satellite key attribue and its set selection. Set selector 36 then uses the regularly assigned attribute of the former Satellite key to select another set.

The following Table H shows a set of letter assignments for 'S1' through 'S8' or Ci through C8. The first row has the vowel letters 'aeiou' and the semi-vowel letters 'rly'. These all frequently follow consonant letters. Consonant keys, as Reference keys, can thus get most of the frequently used consonant-vowel and consonant-semi-vowel combinations with Satellite keys. The second row of 'lmntprsv' consonant letters similarly frequently follow vowel letters in vowel-consonant combinations. Different vowel keys might have different sets of consonant letters for more optimum combinations at the cose of more learning.

TABLE H

SECOND KEY LETTER ASSIGNMENTS

| S1 | S2 | S3 | S4 | S5 | S6 | S7 | S8 |
|---|---|---|---|---|---|---|---|
| a | e | o | i | u | r | l | y |
| l | m | n | t | p | r | s | v |

The set select side of the screen of Table B shows 'w' representing a Reference Key along with the Satellite Key letters in the relative key positions for the 'S1' through 'S8" lables. Processor 30 supplies the letters and other data necessary to display the letters in the proper positions to selector 36. Selector 36 in turn copies the data to display 44 for relay via fetch display 45. As previously mentioned, when if a Satellite Key is actuated with a First Key, switcher 40 supplies selector 36 with the assigned letter as a new set select input. Users, guided by the display, can thus operate Satellite Keys to obtain two-letter sets with one-hand operations. When the Table H assignments are known, the user can operate first keys and Satellite Keys together rapidly.

For inflection selection, the 'S1' through 'S8' assignments are simply the eight slots of Table C with the most frequent inflections and the various substitutions. The member selecting key becomes the Reference Key and the Satellite Keys have the inflections for the eight slots of Table C assigned. Display 44 presents the inflection text with respect to the member select key in the patterns of FIG. 6. As for set selection, operation of member and Satellite Key by the same hand at substantially the same time type member and inflection rapdily. Having to maintain Reference and Satellite Key order imposes no penalty where the user requires display guidance.

Users can soon learn the sets of Satellite Key letters and the sets of frequently used inflections. If the Reference and Satellite Key operations could be independent of order, many could further speed up typing.

Users are free to use any or none of the Satellite Key features. Any or all of the Satellite Key letters can always be typed in the usual manner with an extra stroke. Similarly, the inflections available from the Satellite Keys can be obtained with an extra stroke from the End Set. The users who are dedicated to higher speed can learn to type a large number of words with substantially stroke by having one or both hand operate Reference and Satellite Key in sequences or combinations. Fast execution of several hundred of the most frequent words could bring stenographic rates within reach.

Just as English users consider inputs for set selection to represent letters, users of Chinese, Japanese, and other non-alphabetic languages can consider inputs to represent phonetic sounds. Operation with phonetic sound inputs would be similar with operations with letter inputs. Writers of non-alphabetic languages may, however, prefer to consider inputs as relating to text elements or parameters. One hand with Satellite Keys can not only input consonant-vowel letter or sound combinations but also such elements as the number of strokes, radicals, and starting strokes of ideographic characters.

Japanese uses inflectional endings for verbs and adjectives similiar to English inflectional suffixes and short postposition words similar to case endings in Latin. Selector 37 can handle the member selection of Japanese word stems followed by the selection of inflections or postpositions with Satellite Keys much as for English. Chinese has few inflections so sets of likely next words might be used instead.

Pages 2–57 of the first microfiche appendix list the C language source code of a developmental program implementing present invention features. The program modules correspond roughly to blocks of FIG. 2. Chord.c module, pages 2–11, relates to chord processor 30; set.c module, pages 12–16, to set_selector 36; member.c, pages 17–21, to member_selector 37; display.c, pages 22–29, to display 44; sat_set.c, pages 30–32, to select_switcher 40; and inflect.c, pages 33–46, to inflections 46. Pages 47–57 include the main( ) function and various header files included in the several program modules. Fetch character 41 receives inputs from putc_user( ) and fetch display 45 from putc_display( ) and clear_display( ) found in various program modules. Set vocabulary 40 has some components in set.c but is not otherwise included in the appendix.

On word starts, the aforegoing program responds to key actuations with a display of a set of words assigned to the key. Release of the key before another is actuated, outputs the one of the most frequently used words in English assigned to the key. Actuation of an other hand key selects the associated member of the displayed set and displays a set of inflections and endings for the selected member. Actuation of another other hand key applies the associated inflection, or ending, to the selected member. Release of the first key, following release of the member key or actuation of another key, outputs a 'space' followed by the selected member with any inflections or endings applied.

Release of the first key before release of the member key or actuation of another other hand key gets and displays the set assigned to the string of the first and member key letters. The same action as just described for the first key set selects and outputs a member of the new set. The operation and release of keys in order extends the input letter string to get additional sets. If the input string does not have an assigned set, operation and release of the Space Bar outputs the string. The model thus either outputs members of selected sets or the input string of characters typed. Holding the Space Bar operated while typing input strings get word set displays but inhibits member selection and the displays of inflection and ending sets.

The model includes satellite key features for both set selection and most frequent inflection selection. Operation of a first key enables same hand satellite keys with likely next letter assignments. The satellite keys are those in positions with respect to the reference key for easy operation by other fingers of the same hand. For set selection, the satellite keys enable one hand to execute chords getting two letter sets. For member selection, the satellite keys enable one hand chords to both select a member and apply an inflection or ending of a most frequent set to the member.

Some words have few or no inflections so the model substitutes words likely to follow the word for inflection set members. The associated keys then get the likely next words to follow the member word and so the output of two words at a time. Nouns are most likely to be followed by most frequent verbs, verbs by articles or prepositions, prepositions by articles, etc. In this model, the sic_codes of words specify both inflection sets and inflections with next words in sets. The inflection and ending sets also include a key assignment for compounding following words to the present member. The control does so by inhibiting the output of the 'space' which normally precedes words.

The satellite and next word features have potential for those dedicated to achieving maximum speed and willing to develop new skills. Many typists, however, may prefer not to use the satellite features. While the just described model does not require use of the satellite features, a model without them is less confusing. Those skilled in the art will recognize that it is relatively easy to delete parts of the program to produce such a model. The deletion of the sat_set.c module, pages 30–32, and deletion of satellite_infl_end( ) of the chord.c module, pages 5–6, are the major changes. Minor changes include deletions of sections of functions calling the deleted functions and change of MF_INFL_TYPE to END_SET_TYPE in member_select( ) on page 18.

As previoulsy mentioned, other input systems 25 may include a keyboard that, unlike keyboard 11, does not produce key release codes. Input systems 25 with such a keyboard might include the BIOS, or other host scan code decoding apparatus, to input key character. A Pen or other non-keyboard device, with handwriting or stroke recognition, can also input characters or other representations. Such inputs connect to input processor 32 rather than to chord processor 30. Processor 32 connects to the host decoding apparatus for scan code producing keyboards and directly to other input systems 25 for character type inputs. Models using processor 32 are herein referred to as actuate only models.

An actuate only model employs a different logic than chord models. This model deletes the satellite key and next word functions, replaces the chord.c module of the just described program with an act_only.c module, and modifies other modules. This model could use key character inputs as well as key actuation inputs. To simplify the disclosure, the act_only module uses the same key actuation inputs as just described for processor 30. The modified source code of the act_only.c module is on pages 58–65; display.c on pages 66–69; inflect.c on pages 69–80; member.c on pages 80–84; and set.c on pages 84–88 of the microfiche appendix. The act_only.c module has most to do with implementing the new logic. The other modules have various modifications to adapt to the new logic and the associated changes.

The model responds to key actuations on word starts with selection of both an MFW and a first key set. Unlike the first key sets of the chord model, these first key sets and the remaining more than one letter sets of this model have both inflections and word stems as members assigned to letter keys. The inflections, like those of the chord model, comprise the most frequent inflection set for the just selected stem. Actuation of an inflection key applies the inflection to the selected MFW or stem and inputs the letter as an attribute for the next set selection. A word stem key selects the word stem and also inputs its letter for set selection. The Space Bar and the punctuation key with Punctuations Strings assigned complete the sets.

Successive letter key actuations select word stems or apply inflections to previously selected stems and input letters to select successive sets. Space Bar actuations output selected MFWs or stems, with or without inflections, and add a 'space'. Punctuation key actuations also output selected MFWs or stems and append Punctuation Strings. If the vocabulary does not have a set for the inputted letter string or when the letter string is broken by a non-letter character, a No Set condition obtains. A selected or inflected stem present at the start of the No Set condition can still be inflected or outputted. Otherwise the input string gets outputted and the system switches to a regular typing mode.

In the regular typing mode, all keys except the Space Bar function as in conventional typing. The Space Bar inputs a 'space' character, as is also conventional, but also switches the system back to the word writing mode and sets up a word start. Non-letter keys with MFWs and first key sets assigned prevent the selection of further sets and so the regular typing mode starts upon completion of action on their MFWs or first stem word stems. The next key actuation gets the No Set condition but can inflect or output the MFW or select a word stem from the first set. A word stem selected for the first set can still be inflected and outputted.

Actuation of the 'Tab' key outputs a selected stem and actuation of the 'Enter' key outputs the inputted letter string. Both outputs are without a following 'space' and set up the word start condition. The next word will then compound with the one outputted by the 'Tab' key or have the string outputted by the 'Enter' key as a prefix. If a word is not produced, the following inputted string outputs automatically joined the the 'Tab' outputted word as a suffix when the No Set condition obtains. The suffix can be terminated by the Space Bar. The 'Enter' key can be used to output strings still finding sets so any suffix can be added by regular typing.

The Backspace key clears the current word and all inputs between word starts and the regular typing mode. In the word writing mode, the '\" or 'appostrophe' key adds its character and, unless the last letter is an 's', also adds an 's' to complete the possessive case. In either case, the key sets up a word start. The '—', or 'dash', key adds its character and also sets up a word start for system typing of hypenated words. The Shift keys, as normally, get upper case characters. When operated and released, they set a flag for one shot capitalization of the next letter. This is rarely necessary as the sentence ending Punctuation Strings set up automatic capitalization of sentence starts.

The vocabulary sets are slight different for this model, having a maximum of 18 word stems rather than a maximum of 15. The display.c module is modified to present the word stem along with inflection sets on the keys for both hands as required for this model. The inflect.c module handles stem sic_codes and text codes for selected stem inflection sets as the chord model does for its most frequent inflection sets. The modified inflect.c module deletes the frequent following words which were included in the chord model. The member.c and set.c modules require minor changes to work with the act_only.c module.

The actuate only model, as described, attempts to remain as compatible as possible with regular typing. The model could work with inputs supplied by a pen input system which recognizes handwritten characters or produces key signals from a virtual keyboard. The handwritten or virtual keyboard inputs would directly substitute for serial inputs of characters or scan codes. Characters might have to be added to the handwritten set for the inputs provided by the Space Bar and the 'Tab', 'Enter' and Backspace keys. The present invention new stroke input system, which provides an improvement over handwriting and other non-keyboard inputs for word writing and for other applications could also supply the necessary inputs.

Figure 8:
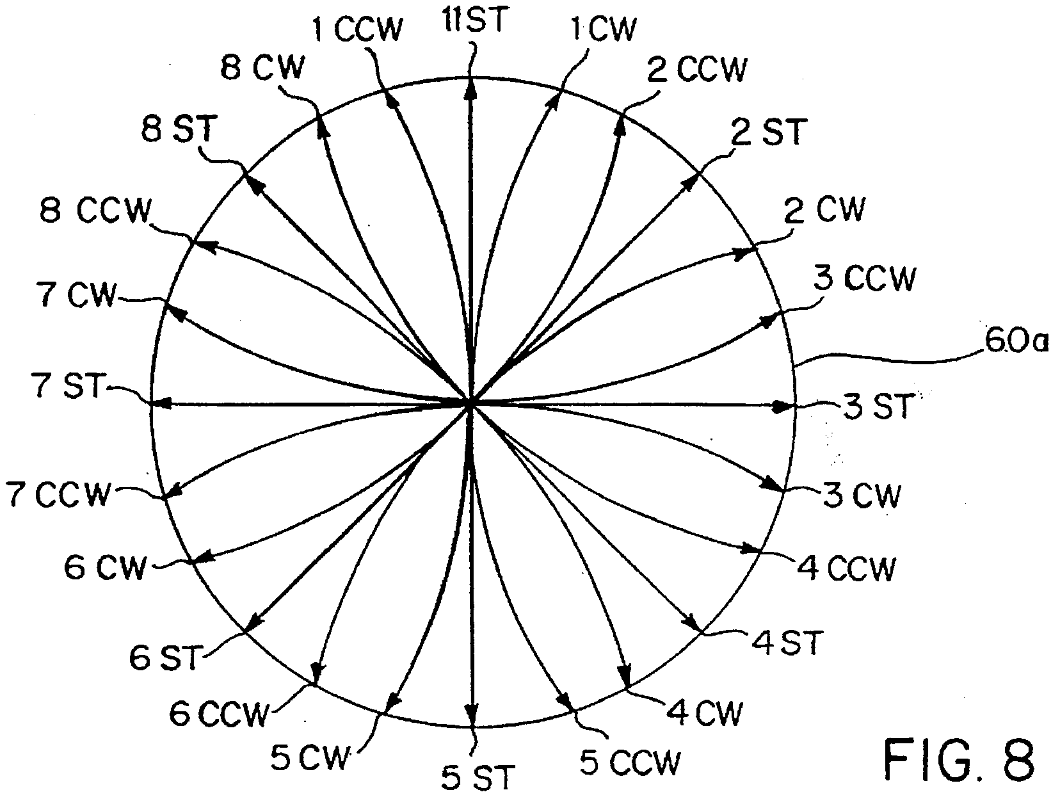
FIG. 8 shows a set of 24 strokes from a common center for a pen or other motion r force device.

FIG. 8 shows a possible set of twenty four strokes from the center of a reference circle 60*a*. These stroke patterns are in one of eight directions and are either straight or curve clockwise or counterclockwise. The straight strokes are labeled 1ST through 8ST, the clockwise curved strokes 1CW through 8CW, and the counter clockwise curved strokes 1CCW through 8CCW. Applications with small sets of inputs or items for selection can use strokes at fewer angles or use only straight strokes. Applications with sets of more than 24 members might increase the number of angles, perhaps from eight to twelve or more, at the cost of increased precision in executing strokes.

Figure 9:
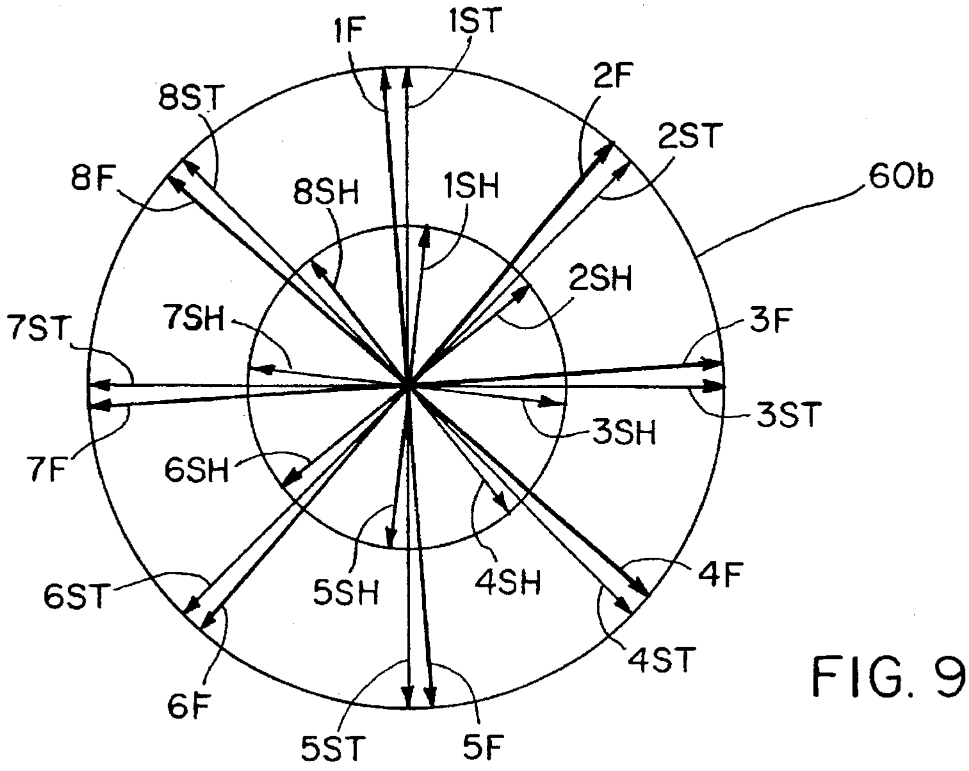
FIG. 9 shows the eight straight strokes of FIG. 9 along with eight fast strokes and eigtht short strokes, all from a common center.

The set of strokes shown in FIG. 8 have the same dimensions of speed, or force, and length, or duration. Different sets of strokes can have different dimensions to offer various types of composite sets, such as larger numbers or only straight strokes. FIG. 9 shows a reference circle 60*b* with the strokes 1ST through 8ST of FIG. 8 included along with fast strokes 1F through 8F. An inner circle 60*c* has the short strokes 1SH through 8SH. If more strokes were needed, curved strokes of different dimensions, more dimensions, and different stroke endings could be added. Few applications, however, will require more strokes than those illustrated in FIGS. 8 and 9.

Figure 10:
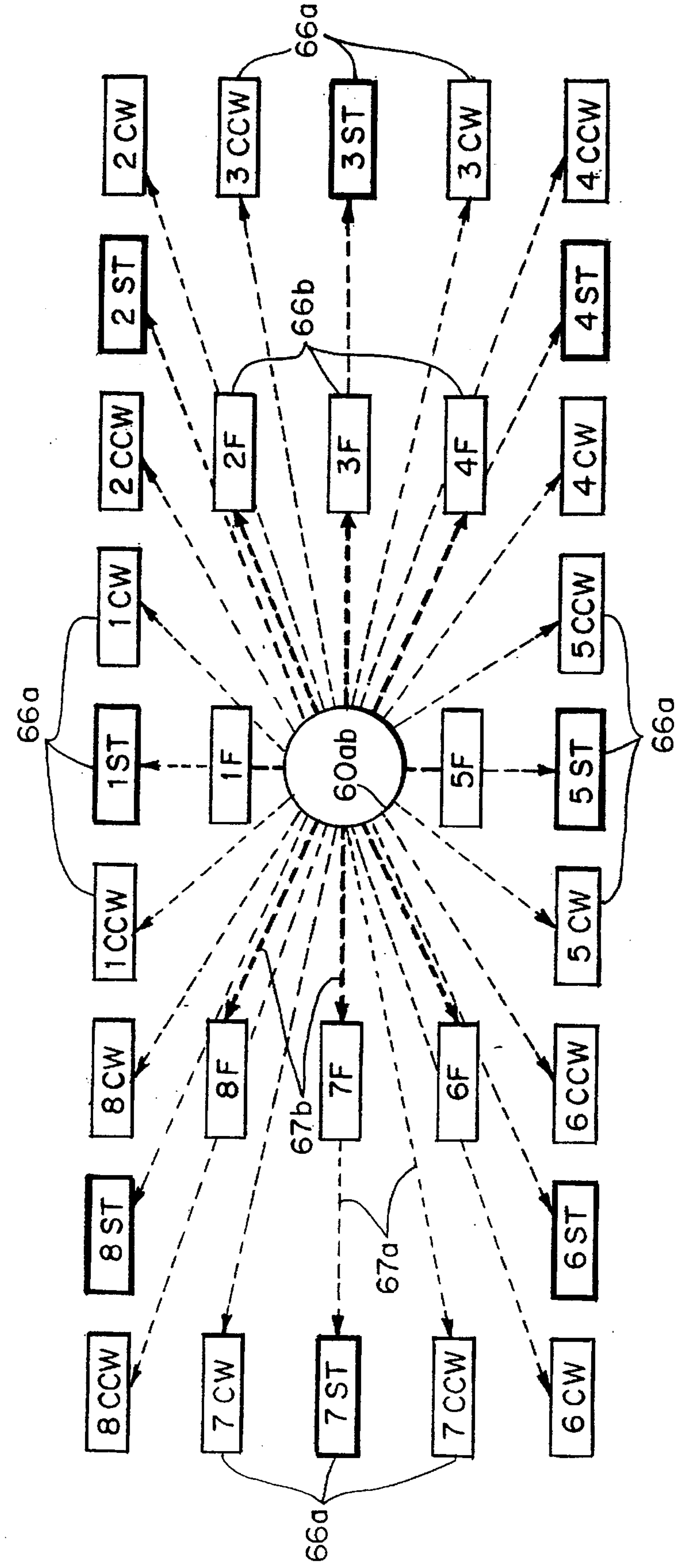
FIG. 10 shows an arrangement of locations for display of items assigned to 32 strokes of FIG. 9 and FIG. 10.

The different directions of the strokes of FIGS. 8 and 9 enable them to easily associate with displays of their input assignments. A circular display of items would provide the most direct spatial association between items and strokes but circular displays are impractical for many applications. FIG. 10 shows a display arrangment of assignment locations 66*a* in an outer rectangle for FIG. 8 stroke assignments and of assignment locations 66*b* in an inner rectangular square for FIG. 9 strokes of shorter length. Circle 60*ab* represents the common stroke execution area and dotted lines 67*a* and 67*b* the projections of the strokes to the respecive assignment locations 66*a* and 66*b*.

The outer rectangle of locations 66*a* differs from a square only in that the locations 66*a* for the 2CW, 4CCW, 6CW, and 8CCW stroke assignments are in the upper and lower rows rather than in the columns and the columns have been moved out allign with the new row members. The locations 66*b* are in a square streched to better correlate with the outer rectangle of locations 66*a*. The dotted lines 67*a* project the FIG. 8 strokes from the inner circle 60*ab* to the locations 66*a* sometimes passing through, or behind, locations 66*b*. The heavy dotted lines 67*b* project the short strokes 1SH–8SH of FIG. 9 from circle 60*ab* to locations 66*b*. FIGS. 8 and 9 strokes originate at the center of circle 60*ab* and associate in direction with assignment items displayed as in FIG. 10. Symbols for the type of stroke, straight, CW, and CCW could be added next to the respective locations 66*a* in the display to supplement the directional associations. Display emphasis for locations 66*a* for straight strokes 1–8ST also assists associations.

Figure 11:
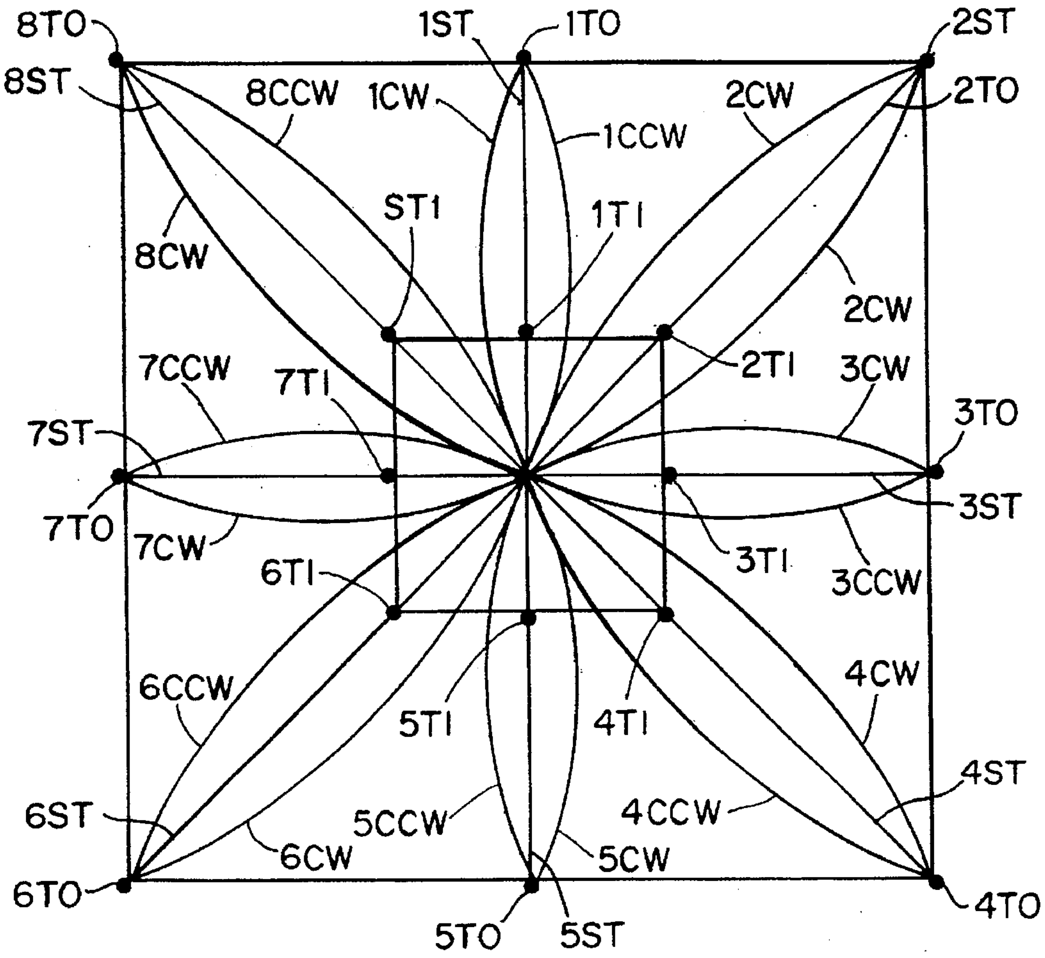
FIG. 11 shows a set of 24 long strokes with eight targets on a rectangular grid and eight more targets for a set of 24 short strokes.

FIG. 11 shows a set of different stroke patterns. FIG. 11 sets up eight outer targets 1–8TO and eight inner targets 1–8TI at the nodes of a rectangluar grid, all with respect to a common center. The targets 1–8TO indicate end points for the respective 1–8ST, 1–8CW, and 1–8CCW strokes using the same designations as the corresponding strokes in FIG. 8. Target 1TO, for example, serves as the common end point for the 1ST, 1CW, and 1CCW strokes. Stroke 1ST follows a straight line from center to target 1TO. Strokes 1CW and 1CCW curve away from the stroke 1ST line and then back to the same target 1TO. Targets 1–8TI serve as similar targets for a like set of short strokes 1–8SH.

Tablets or pads can be overlaid with grid paper or grid paper used with a pencil or ink pen to assist users in learning targets and stroke patterns. Visualization of targets and patterns makes proper execution of strokes easy. Strokes 1–8CW and 1–8CCW associate with assignments either as in FIG. 10 or with CW and CCW locations swapped. The former association correlates ending directions, and the latter starting directions, with assignment directions. The 1–8SH strokes to targets 1–8TI have not been illustrated. It is obvious that part or all of the set of targets 1-TI might be used with any or all of the type of strokes shown with targets 1–8TO.

The previously described FIG. 10 shows an arrangment of display locations 66*a* and 66*b* for item assignments for 32 strokes. It will be recognized that models for 24 strokes might use the 24 outer rectangle locations 66*a* only. A model for eight straight strokes could use the inner locations 66*b* or the corresponding eight of locations 66*a*. Further, a 11 stroke model might use the straight and curved strokes of FIG. 9 at four directions, up, down, right and left, and a display arrangment of half of locations 66*a*. A four stroke model needs only straight up, down, right and left strokes with four locations 66*a* or 66*b*.

For word writing system applications, stroke models can either cover both system and regular keyboard assignments or retain a keyboard for non-system keyboard assignments. As the former involves more than 50 keys, more than 32 strokes or Shift means are necessary. Such means can render 24 strokes, as well as 32, adequate for both system and regular keyboard functions. Most of the system inputs for the actuate only model come from 30 keys. The 32 strokes of FIG. 10 could substitute for the 30 keys and two more, such as the "\" key and Space Bar. The following Table 32 shows the keys substituted for by the strokes of FIG. 10.

TABLE 32

FIG. 10 Stroke/Key Substitutions

| | | | | | | | | |
|---|---|---|---|---|---|---|---|---|
| q | w | e | r | t | y | u | i | o |
| z | | j | | k | | ' | | p |
| x | | Space Bar | | | | ; | | l |
| c | | , | | . | | / | | v |
| a | s | d | f | g | h | b | n | m |

The keys of Table 32 replaced by strokes covered most of the word writing system functions of the actuate_only model. The Table 32 substitutions give strokes the same functions and so a word writing capability. In addition to the substitutions, displays of the actuate only model have to be changed to present the previously described stroke assignment relations. As will later be explained, the assignments are such that the display complexity can be reduced to two rows after training is completed. The ten MFWs of the digit keys and the regular keyboard functioning of other keys can be covered by a shift set of strokes. The keys remain as a possible alternative to a shift set with some performing their usual functions. Others, such as the Space Bar, could combine with strokes for a special type of chord to speed operations.

Stroke start locations are an alternative to auxiliary keys for access of different stroke assignments as well as to a wide range of different functions. As word writing applications usually involve a word processor, an important other use of start locations is to conveniently switch strokes from text inputs to word processor control inputs. Other uses include rapid access to other programs such as operating systems, data bases, etc. Again for word writing, start locations can switch access to auxiliary vocabularies for custom or technical words as well as select different sets of MFWs and accompanying first sets.

Even 32 stroke systems require means, such as auxiliary keys or strokes, for different sets of assignments, upper case characters, etc. Such means also make 24 stroke word writing models possible. A 24 stroke system, with single dimension strokes and a simpler display, has advantaages. Key to stroke substitutions of the following Table 24 are the same as those of the outer boundaries of Table 32 except that 'j' and 'k' replace 'z' and 'x'. The 'j' and 'k' key stroke slots get the plural and past tense inflections which were assigned the 'z' and 'x' keys. The punctuation keys, the 'x' and 'z' keys and the Space Bar, if not otherwise handled, move to the Shift set.

TABLE 24

FIG. 10 Stroke/Key Substitutions

| | | | | | | | | |
|---|---|---|---|---|---|---|---|---|
| q | w | e | r | t | y | u | i | o |
| j | | | | | | | | p |
| k | | | | | | | | l |
| c | | | | | | | | v |
| a | s | d | f | g | h | b | n | m |

Except for 'j' and 'k' being moved to the 'z' and 'x' key slots of Table 32, the Table 24 stroke assignments are the same as those of corresponding slots of Table 32. Conversion of strokes to the respective key scancodes for input to the actuate only model get the various assignments in response to strokes. Modification of the actuate only displays to the FIG. 10 patterns then complete 32 and 24 stroke models. It will, of course, be recognized that the keyboard restrictions of the actuate only model need not be imposed on stroke only models. Other stroke assignment patterns could be more suitable for non-keyboard users.

It will be recalled that the actuate only model used keys to select MFWs and word stems and either the Space Bar or punctuation keys to output them. The Space Bar operated substantially with the selection key, as in a chord, got MFWs outputs in nearly the time fop one key stroke. Stroke models can similarly use the Space Bar and other hand operated auxiliary keys in combination with strokes as special type of chord. Such chords can select and output MFWs and other words in nearly the time for single strokes. Alternatively, stroke models can output MFWs and members when the selecting stroke ends with the lift of a pen or in a special way.

Figure 12:
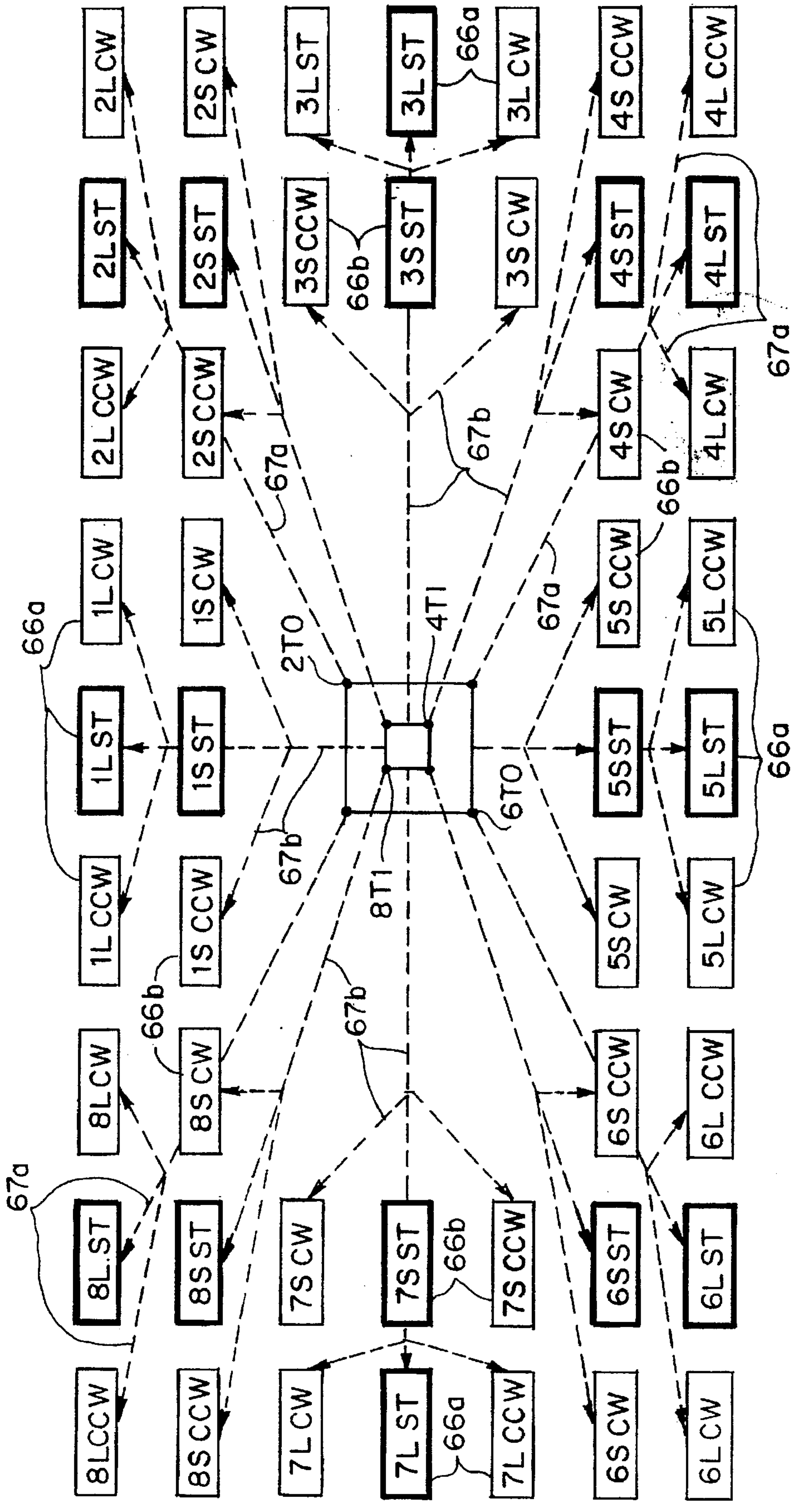
FIG. 12 shows an arrangement of locations for display of items assigned to the 48 possible strokes of FIG. 12.

Two sets of 24 strokes, distinguished by length or speed, total 48 and so obviate the need for a means to select different assignments. Addition of a second set of straight and curved strokes to the inner targets 1–8TI of FIG. 11, for example, provides 48 strokes. FIG. 12 shows a display pattern of 48 display locations for the 48 stroke assignments. The closer rows and columns relate to the shorter strokes, 1–8SST, 1–8SCW, and 1–8SCCW, and the outer rows and columns to the longer strokes, 1–8LST, 1–8LCW, and 1–8LCCW. The assignment locations conform to the target locations except as modified to fit the nine short stroke assignment rows with the same length as those for the longer strokes.

Character, MFW and other assignments that are fixed only require display assistence for training. Changing assignments, however, require continued display guidance. Table 32 and Table 24 assignments have the changing ones in the locations 66*a* of upper and lower rows of the FIG. 10. Two row displays can thus show all of the variables and so suffice for after training displays. The two upper and two lower rows of FIG. 12 similarly have the varibles and thus enable reduction of after training displays to four rows. Deletion of fixed data leaves changing data easier to find.

Figure 13:
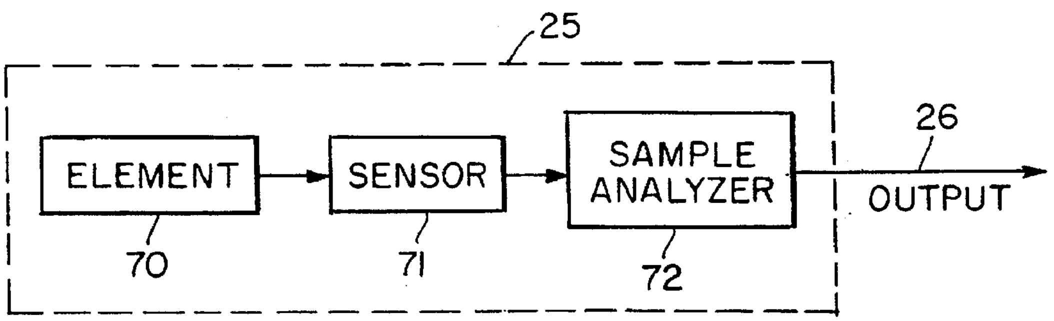
FIG. 13 is a functional block diagram of a stroke input system.

FIG. 13 is a simple block diagram of non-keyboard embodiments of other input systems 25 of FIG. 1. Input systems 25 provide inputs to input processor 32 of FIG. 2. The non-keyboard embodiments include touch display position input systems and stroke input systems. Element 70 can be a finger for touching the display screen or a pen or joystick or similar device for position or stroke inputs. Sensor 71 detects position or movement of element 70 and produces outputs to represent positions and/or movement coordinates. Sensor 71 outputs go to sample analyzer 72 which processes the samples and responds with outputs for positions and/or strokes.

Element 70 and sensor 71 may comprise such apparatus as a touch responsive display screen, pen and tablet, mice, joysticks, etc. Sensor 71 outputs represent either position or change in position of element 70, generally as sampled at regular intervals. For touch screen inputs, analyzer 72 converts positions to outputs for the areas touched and so to inputs for displayed items. For stroke input systems, analyzer 72 produces outputs for the stroke start positions and/or the identities of the strokes for the patterns of movement. Start position inputs have various possible uses as previously discussed. Stroke outputs go to processor 32 for word writing functions or to other applications.

Apparatus such as the ACECAD D-9000 pen and tablet include a built-in microprocessor to sample postion and/or movement and to convert sample frames into serial outputs to emulate different systems. Host computers have serial ports to receive sample data and drivers to handle inputs from one or more systems. Pen systems with built-in microprocessors could be modified to have the microprocessor also run a program which implements analyzer 72 functions. The sample data could then go directly to the program with elimination of timing and other complexities of interfacing. The serial link would only have to handle analyzer 72 outputs.

Interrupts to signal the arrival of stroke inputs at the serial port would be much like the keyboard interrupts which signal key events. A stroke interrupt routine could supply stroke inputs to applications in place of, or in addition to, key inputs. Lacking a built-in microprocessor to handle an analyzer 72 program, interrupts could still signal the arrival of sample frames at the serial port. The analyzer 72 program would be run by the host computer and could include an interrupt routine for sample data frames. Without serial port interrupts, the analyzer 72 program would have to repetitively check serial port inputs to avoid missing data, as does the kb_st.c module the driver of the mouse.c module, pages 101–105 of the microfiche appendix. The kb_st.c module calls the analyzer 72 program for non-zero samples and looks at keyboard outputs input both key events and strokes to such as the actuate only model.

Touch sensative display screen apparatus, such as the Scenario Dynavision (formerly Dynabook) provide very easy to learn inputs for word writing. Actuate only models, for example, display key assignments on a keyboard map. With a touch sensative screen, users touch the display areas, instead of operating the keys, to get the assignments. The get_touch( ) C function shown on page 95 of the microfiche appendix, converts position coordinates, such as from touch screens, to the display areas associated with keys and then uses the areas to access the corresponding key scancodes for input to such as the actuate only model.

Position data is necessary for touch area inputs and for start position inputs. An analyzer 72 function, such as get_touch( ) with a touch down signal detector, would produce inputs for the positions at which pens are first touch down much as for touch screen inputs. Analyzer 72 programs to determine stroke patterns can use movement or position inputs. Different elements 70 and sensors 71 may be more accurate in one than the other and so dictate the choice. Some devices produce accurate position outputs when stationary and erratic outputs during rapid movements.

Stroke input systems can use various types of patterns for strokes. FIG. 8 shows sets of straight and curved strokes with the same starting angles. The starting angle indicates one of the eight sets and the starting ending angle difference one of the three members, straight, curved CW or curved CCW. The patterns can vary in length or speed as indicated by FIG. 9. If individual samples are accurate, analyzer 72 can determine the starting and ending angles from single samples of movement coordinates or from pairs of successive position samples. With somewhat erratic sample data, analyzer 72 will average several starting samples for the starting angle and several ending samples for the ending angle.

FIG. 11 strokes are different in that they proceed from a start position to an end target either in straight or in CW or CCW curved lines. Targets can be distanced for short or long strokes. Rectangular grids assist users in learning to visualize target locations and execute strokes. With element 70 stopped for stroke starts and ends, devices that supply accurate position data when stationary enable analyzer 72 to accurately determine stroke angles. Analyzer 72 compares the starting angle, as determined by one or more starting samples, with the stroke angle to determine curvature. Alternatively, the deviations from the stroke angle could be averaged over the stroke.

The get_strk.c program module, listed on pages 95–101 of the microfiche appendix, is an embodiment of analyzer 72 for stroke determinations. The module has alternative functions for FIG. 8 and FIG. 11 type strokes. An input control program, such as that of the kb_st.c and mouse.c modules, calls the get_input( ) function with sample movement coordinates from sensor 71 as arguments. Get_input( ) calls other functions to process sample, data, identify strokes, and convert strokes to key scancodes according to Table 32 or Table 24. Get_input( ) returns the scancodes to the input control program for input to the actuate only model.

Get_input( ) calls check_start( ) to determine when a stroke has started and check_end( ) to processs following sample data to determine stroke ends. The listing has two versions of the short_stroke( ) and get_stroke( ) functions, one for FIG. 11 and the other for FIG. 8 type strokes. Check_start( ) and check_end( ) detect pen stops and pen slow downs and speed ups as boundaries between strokes. Stops, or pauses, between strokes do not add a time penalty for users who use the display for next items. Experienced users able to rapidly execute stroke sequences for frequently used words, however, may be penalized by stops or pauses.

The get_stroke module could be modified to include the listed angle_break( ) function to detect abrupt angle changes between strokes. Stroke sequences could then be executed as rapidly as possible with abrupt angle changes. Stops or slow downs could still be used where small, or no, angle changes occur between successive strokes. Another way to get stroke boundaries without intravening stops or pauses, where are identified only by angle and curvature, is to establish definite lengths or intervals for strokes. Such limits could be used along or in combination with angle changes, abrupt or gradual, to locate boundary points and determine whether single or multiple strokes were to be identified.

Length, however, is a valuable dimension for doubling the number of strokes available. Where pen lifts do not satisfactorily signal word endings, longer lengths can signal last strokes to save another stroke or auxiliary key. Longer strokes require little more time than short strokes as accelleration and decelleration take most of the stroke interval. Pen lifts are superior if cleanly signalled by the pen and tablet used.

Users execute strokes with pen devices for element 70 much as they would with a regular pen or pencil. The tablet can include a grid pattern to guide users while learning stroke patterns. Or beginners can use ink pens and grid paper for practice in executing strokes. Experienced users should be able to execute successive strokes for words while looking at the display. Each stroke starts from the end of the last but with the assumption that the starts remain in the same location and so relate to the display in the same way. As the pen meanders over the tablet with successive strokes, occassional repositioning becomes necessary to keep the pen in a convenient area.

Lift of a pen, as previously mentioned, is a good way to signal word endings. It also allows repositioning and affords the opportunity to make stroke start location inputs or selections after each word. The pens used preferrably abruptly signal break of contact with the tablet. Other pens may require auxiliary switches, either on the pen or positioned for operation by the other hand, to signal word endings and repositioning. As also previously mentioned, the preferred pen apparatus has a built-in microprocessor which runs an analyzer 72 program, such as the get_stroke module.

It will be recognized that the various embodiments are by way of example and that the present invention system teaching can be used in various ways to design other models. Chord type models, for example, could use the Space Bar to determine set and member select hands in place of sequential order. The responses to key combinations would then be without regard to sequential order and keys of combinations or chords could be operated as nearly together as possible. Such models could get larger numbers of the more frequently used words with single chord strokes to enable attainment of maximum typing speed. Users would be those dedicated enough to develop the necessary skills for high speeds.

The actuate only type model, for another example, could be modified to enable inflection and endings sets with 'Tab' or 'Enter. Such a model would have larger word sets not mixed with inflections and endings. The inflections and endings sets could also be larger. Inflections and endings would require the extra operation of 'Tab' or 'Enter' but, once the inflections and endings sets were learned, the operations could be almost as part of chords with the inflections and endings keys. 'Tab' and 'Enter' will also be used in combinations to end inputs strings and set up compounding of next words in place of the old 'Tab' and 'Enter' functions.

Pen or Touch and other hand keyboard models with hybrd chords are still another example. The Pen or Touch part of the system selects sets and members as previously described. The other hand keyboard section selects inflections and endings for the selected members. While one hand executes strokes or touches, the other hand simultaneously applies inflections or punctuation strings to the word stem being selected. Or the other hand keys may simply add a 'space' and output the selected word without a pen lift or special stroke ending. As the other hand functions are limited, the key operations can soon become semi-automatic to detract little from attention to stroke or touch execution.

Further examples include stroke models with alphabetic or other arrangements of letter assignments unrestricted by keyboard considerations and easy for beginners to learn, stroke models with two sets of MFWs and first sets along with smaller sets limited to vowel or consonant next letters, low frequency sets with no two words having the same next letter, stroke input systems keyed to letters or other symbols rather than to spacial patterns.

The microfiche appendix provides many more details of model features and of ways to implement them.

I claim:

1. A method for supplying words to a text handling system responsive to inputs fewer in number than the number of attributes of said words performed by computer apparatus including a data processing unit, a memory, a display, a set of input means, and a set of word attributes each assigned to an input means, said method comprising the steps of:

a) arranging a vocabulary of words in first through Nth pluralities of word sets, wherein each of the word sets of said first plurality consist of words sharing at least one attribute, wherein each of the word sets of the Nth plurality consist of words sharing at least N attributes;

b) storing said word sets in said memory for access responsive to input of the attributes shared by all of the words of the respective sets;

c) inputting the attributes of a wanted word one at a time in turn by operation of an input means to access word sets with words sharing the attributes inputted;

d) accessing a vocabulary word set responsive to input of each attribute and previously inputted attributes, wherein input of successive attributes for a wanted word accesses word sets of succcessively higher order pluralities;

e) temporarily assigning each of the words of the currently accessed word set to an input means f) displaying the currently accessed word set with each of the words associated with its assigned input means;

g) selecting the wanted word from the currently displayed word set responsive to operation of its associated input means;

h) temporarily assigning each of a set of inflections to an input means;

i) presenting inflections for the currently selected word with each inflection associated with its assigned input means;

j) applying an inflection to the currently selected word responsive to operation of its assigned input means; and k) outputting the selected and inflected word responsive to operation of an input means.

2. The method defined in claim 1 wherein the words in the vocabulary include inflection codes and wherein some of the inflections presented in step i) depend on the inflection code of the currently selected word.

3. The method defined in claim 1 wherein the input means includes a moveable element, a set of prescribed single motion patterns each having a shape and a direction, and means for producing input actions responsive to movement of the element in any one of the set of prescribed patterns.

4. The method defined in claim 3 wherein step f) displays the currently selected word set with words in positions about a reference location that associate each word with its assigned pattern and wherein movement of the element in a prescribed pattern selects the word assigned to the respective pattern.

5. The method defined in claim 3 wherein the prescribed patterns each have an assigned attribute and wherein movement of the element in a prescribed pattern inputs the attribute assigned to the respective pattern.

6. The method defined in claim 1 wherein step b) also stores a single zeroth order word set of the most frequently used words of the language; and wherein is included the step of temporarily enabling an input means to output a word of said zeroth order set; and wherein step k) outputs said word responsive to operation of the enabled input means.

7. The method defined in claim 1 wherein step a) puts the more frequently used words in the lower order word sets.

8. A method for inputting data items to a data handling system performed by computer apparatus including a data processing unit, a memory, a display, and an input means including a moveable element and a set of single motion patterns each having a shape and a direction, said method comprising the steps of:

a) storing a set of said data items in memory;

b) assigning each data item to one of said patterns;

c) displaying the data items in positions about a reference position to associate the data items with the patterns to which they are assigned;

d) moving the element in a pattern to which a wanted data item is assigned;

d2) sensing the position of said element at periodic intervals;

e) determining the pattern executed by movement of said element from the sensed successive positions of said element; and f) inputting the data item assigned to the pattern determined to have been executed to the data handling system.

9. The method defined in claim 8 wherein the set of single motion patterns include straight lines in each of N directions.

10. The method defined in claim 9 wherein the set of single motion patterns include curved clockwise and curved counter clockwise lines in each of N directions, and wherein step c) displays the data items assigned to the clockwise and counter clockwise lines displaced clockwise and counter clockwise respectively from the positions of the data items assigned to the straight line patterns.

11. The method defined in claim 8 wherein the set of single motion patterns consist of a first subset of patterns and a second subset of patterns with a different parameter of length or speed, and wherein step c) displays the data items assigned to said second subset in positions about the periphery of the display positions of the data items assigned to the first subset.

12. The method defined in claim 8 wherein said single motion patterns consist of staight, curved clockwise, and curved counter clockwise lines in N directions.

13. The method defined in claim 8 wherein said data handling system includes a word based text producing system and said data items provide inputs for said word based text producing system.

14. A method for supplying words to a text handling system with fewer inputs than the number of letters of said words performed by computer apparatus including a text handling system, a memory, a display, and a set of input means assigned to letters of the alphabet, said method comprising the steps of:

a) arranging a vocabulary of words in first through Nth pluralities of word sets, wherein each of the word sets of said first plurality consist of words sharing a single starting letter, wherein each of the word sets of the Nth plurality consist of words sharing N starting letters;

b) storing each of said word sets in said memory for access by input of the letter string shared by the word set;

c) inputting one or more starting letters of a wanted word one at a time in turn by operation of the assigned input means;

d) accessing the word set for each starting letter string inputted, whereby successive letter inputs access successively higher order word sets;

e) temporarily assigning each of the words of the currently accessed word set to an input means;

f) displaying the words of the currently accessed word set with each of the words shown associated with its assigned input means;

g) selecting a wanted word from the currently displayed word set responsive to operation of its assigned input means; and h) outputting the selected word responsive to operation of an input means.

15. The method defined in claim 14 including step i) second temporarily assigning each of a set of inflections for the currently selected word to an input means; step j) displaying inflections for the currently selected word with each inflection shown associated with its respective input means; and step k) applying an inflection to the currently selected word responsive to operation of its assigned input means.

16. The method defined in claim 14 wherein step b) stores the portion of each word following the shared starting letter string; wherein step f) combines the inputted letter string with the stored word portions; and wherein step h) outputs the inputted letter string followed by the selected word portion.

17. The method defined in claim 14 wherein said input means includes a moveable element, a set of single motion patterns including N straight lines, N curved clockwise lines, and N curved counterclockwise lines in N directions; and means for producing input actions responsive to movement of the element in any one of the set of prescribed patterns; and wherein step f) presents the words of the currently selected set in positions about a reference location that associate each word with its assigned pattern.

18. The method defined in claim 14 wherein step b) also stores a single zeroth order word set of the most frequently used words of the language; wherein is included the step of temporarily enabling an input means to output a word of said zeroth order set; and wherein step h) outputs said word responsive to operation of the enabled input means.

19. The method defined in claim 14 wherein step a) puts the more frequently used words in the lower order word sets.

20. The method defined in claim 15 including the step of storing spelling modifications of word ends and inflection starts and wherein step includes the step of modifying the spelling of the end of the selected word and the start of the applied inflection according to said modifications.

* * * * *